United States Patent [19]
Nakaguchi

[11] Patent Number: 5,563,896
[45] Date of Patent: Oct. 8, 1996

[54] ERROR CORRECTION PROCESSOR AND AN ERROR CORRECTING METHOD

[75] Inventor: Yukimi Nakaguchi, Kasugai, Japan

[73] Assignee: Fujitsu Limited, Kawasaki, Japan

[21] Appl. No.: 485,122

[22] Filed: Jun. 7, 1995

Related U.S. Application Data

[63] Continuation of Ser. No. 923,987, filed as PCT/JP92/00050 Jan. 22, 1992, published as WO92/13344 Aug. 6,1992, abandoned.

[30] Foreign Application Priority Data

Jan. 22, 1991 [JP] Japan .................................. 3-005734
Jul. 26, 1991 [JP] Japan .................................. 3-187333

[51] Int. Cl.$^6$ .................................................. G06F 11/10
[52] U.S. Cl. ........................................ 371/37.1; 371/40.1
[58] Field of Search ................................ 371/37.1, 37.5, 371/37.7, 42, 43, 46, 40.1; 369/32, 53, 54; 375/365, 368

[56] References Cited

U.S. PATENT DOCUMENTS 4,646,301  2/1987  Okamoto et al. ...................... 371/37.4
5,068,857  11/1991  Yoshida .................................. 371/37.4

FOREIGN PATENT DOCUMENTS 2-214073  8/1990  Japan.

*Primary Examiner*—Paul P. Gordon
*Attorney, Agent, or Firm*—Staas & Halsey

[57] ABSTRACT

The present invention relates to a processing method in an error processor and is intended to speed up a chain search and reduce correcting and processing time without an increase in the amount of hardware. An error correction processing in which operation circuits are provided so as to obtain solutions to the terms of an error position polynomial that is processed from data of coded words read out from a recording medium of which elements comprise Galois fields; operation circuits process in sequence the values of the terms of said polynomials to the variables comprising Galois fields in synchronization with clock signals, obtain the solutions of said error position polynomial by adding the values of the terms from operation circuits in the EOR (Exclusive-OR) circuit and thus detect an error at each position of data according to the solutions obtained; and the solutions corresponding from the low order position to the high order position of the read-out data are obtained in sequence by processing in said operation circuits.

6 Claims, 15 Drawing Sheets

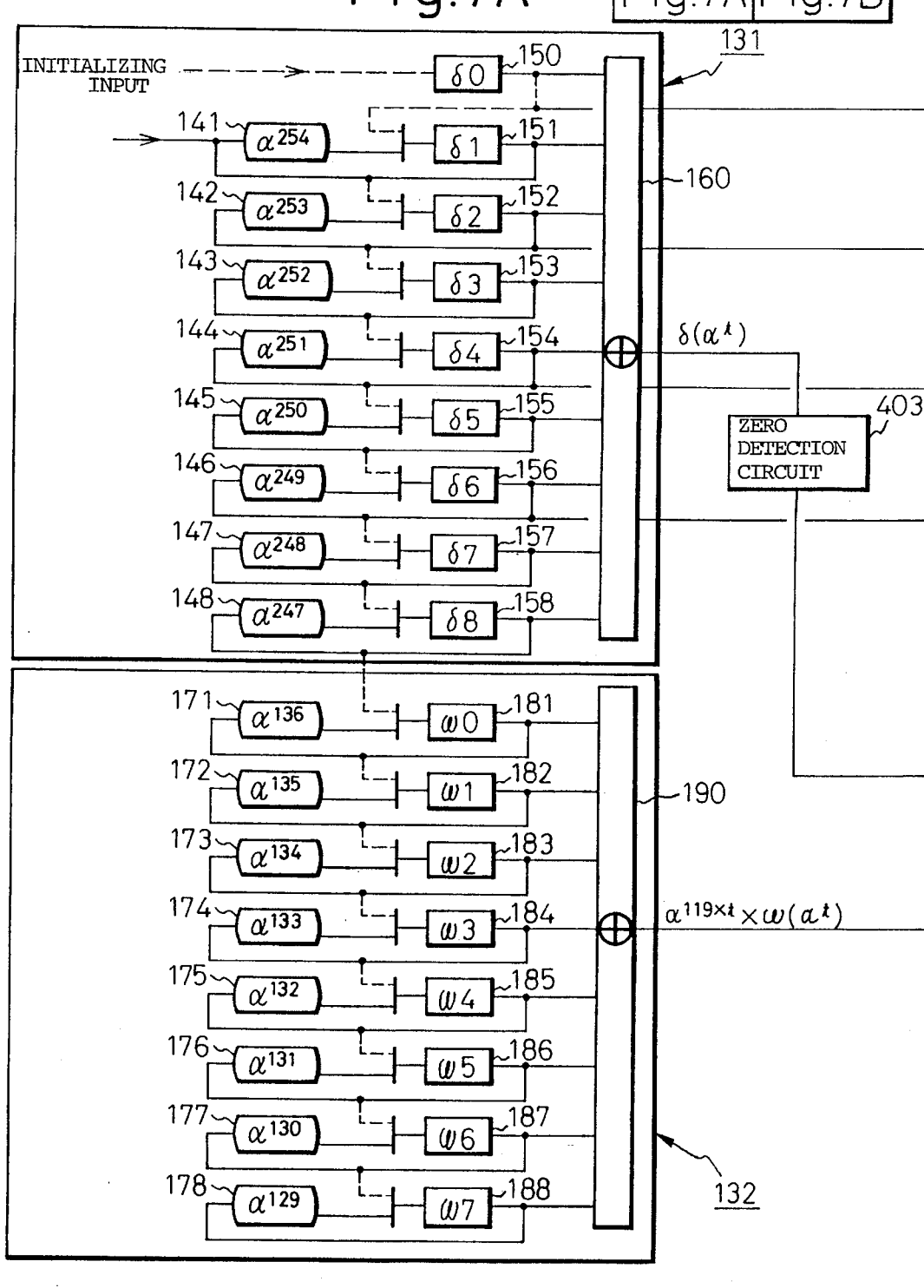

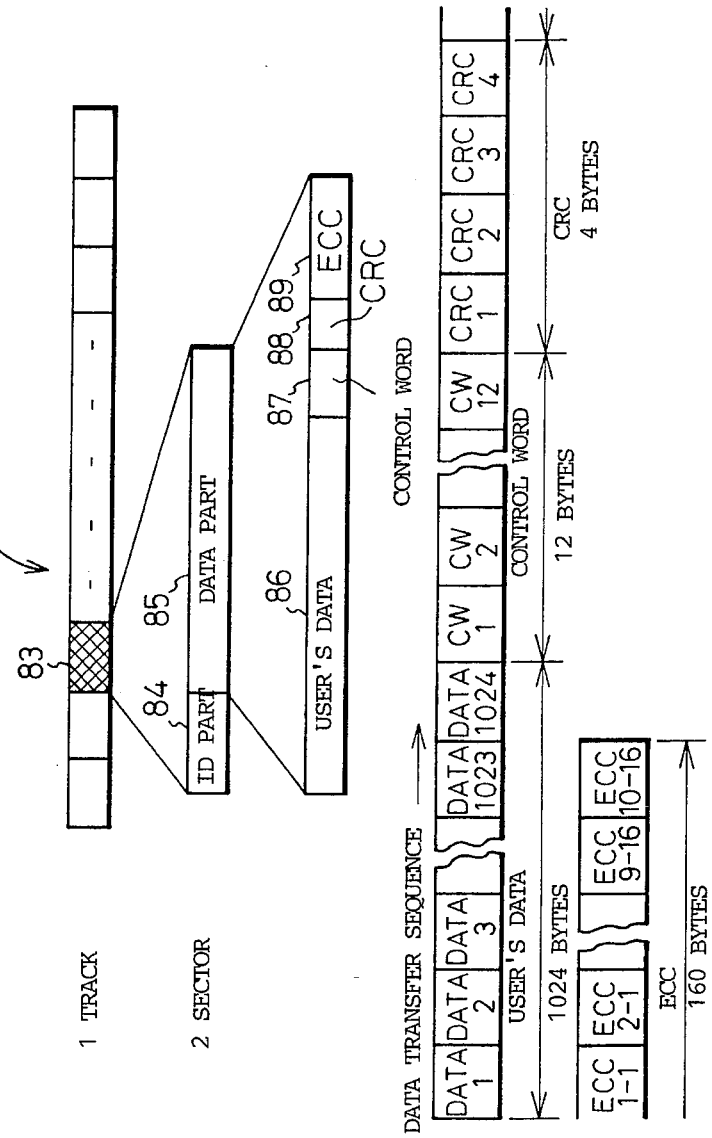

120 BYTES

ERROR CORRECTION PROCESSOR AND AN ERROR CORRECTING METHOD

This application is a continuation, of application Ser. No. 07/923,987, filed as PCT/JP92/00050 Jan. 22, 1992 published as WO92/13344 Aug. 6, 1992, now abandoned.

TECHNICAL FIELD

The present invention relates to a processing method in an error correction processor, more particularly a processing method in a system for determining an error position when reading the data from a recording medium such as an optical disk and further a method for obtaining a syndrome of a polynomial that is deemed from data read during processing the data of a recording medium such as an optical disk in a syndrome generating method by an error correction processor.

BACKGROUND ART

Lately, along with the general tendency toward larger capacity recording media such as optical disks, increased data reading speeds have been in demand. Particularly, the reduction of processing time in error correction processors that require a long processing time has been in demand. Therefore, for a reduction in the processing time, the processing speed in the circuits used in the error correction processor should be increased.

In conventional optical disk apparatuses, the error rate of the recording medium (optical disk) is extremely high and a powerful error correction code (ECC) is required. Therefore, a Reed Solomon code has been used as the error correction code ECC for the optical disk. The Reed Solomon code is a byte correction code that treats one byte as an element of a coded word and determines which byte failed and how it did.

Conventionally, a coding system for coding a lot of data with the Reed Solomon codes for the optical disk has been used in combination with an interleave method.

The following describes an example of the structure of arrays of recorded data in the optical disk, referring to FIGS. 8 and 9. As shown in FIG. 8(A), the optical disk 80 is provided with a spiral track 81, one track 82 corresponding to one specified circumferential portion of the spiral track is defined as a single information segment, one track 82 comprises a plurality of sectors 83 as shown in FIG. 8(B), and each sector 83 comprises an ID part and a data part 85 as shown in FIG. 8(C).

In addition, as shown in FIG. 8(D) the data part 85 comprises a user data part 86, a control word part 87, a CRC part 88 and an ECC part 89.

The detailed structure of the data part 85 comprises, as shown in FIG. 8(E), data of 1,024 bytes (DATA 1~DATA 1024), a control data word (CW1~CW12) of 12 bytes, CRC data of 4 bytes (CRC1~CRC4) and ECC data (ECC1~ECC160) of 160 bytes in the order of data transfer.

Data corresponding to each sector as described above is actually arranged as shown in FIG. 9 and the code length shown in FIG. 11 is formed with ten coded words, each of which comprises 120 bytes. A line of the array (one coded word) is called one interleave and error correction is carried out for each interleave. Each of interleaves 0~9 comprises the error correction code (ECC part) and an information symbol (data part). In FIG. 9, low order 16 bytes, that is, position 0~ position 15 form the ECC part. In the interleave, the number of information symbols (the length of the data part) is formed with high order 104 bytes (position 16~ position 119) except the ECC part. The Reed-Solomon code with an extremely high correction ability is used as the error correction code for each interleave.

Though information symbols (data part) corresponding to one sector of the array are 104 bytes×10=1040 bytes as shown in FIG. 9, the information symbols are formed with 1036 bytes since the CRC (Cyclic Redundancy Check) code is contained in position 16 of interleaves 6~9. The CRC code is included in the data array and is not used for error correction but is used for verifying the result of error correction based on the ECC.

In other words, for reading the data as much as one sector on the optical disk, error correction is carried out for each of interleaves 0~9. Then, whether error correction has been properly carried out, is determined based on the data obtained by removing the inspection symbol (ECC part) from the data for which error correction has been finished.

The Reed-Solomon code with an extremely high correction ability is used as the error correction code ECC formed in the interleaves 0~9, and 8 bits of data, that is, 1 byte is treated as an element of the coded word, and which byte of one interleave and how it is faulty is determined. This Reed Solomon code of the optical disk uses the elements of the coded word as an element of the Galois finite field GF ($2^r$) for byte correction.

The following briefly describes the Galois finite field ($2^r$). The Galois field is a set of numbers having the laws of calculations and, if r=8, the number of elements of the Galois field is 256 (=$2^8$).

The elements are denoted as shown below:

$$0, \alpha^0, \alpha^1, \alpha^2, \alpha^3, \ldots \alpha^{252}, \alpha^{253}, \alpha^{254}, \alpha^{255}$$

Provided, $\alpha^0=\alpha^{255}=1$ is given and the values of elements are expressed as the numerical values within the range of $1 \leq \alpha^n \leq 255$.

The Galois field is such that all four rules of calculations including multiplication and division are completed; for example, $\alpha^3 \cdot \alpha^3 = \alpha^6$ and $\alpha^{250} \cdot \alpha^{10} = \alpha^{260} = \alpha^5 \cdot 5$ of $\alpha^5$ is a remainder when 260 is divided by 255. Addition and subtraction can be carried out with Exclusive OR (EOR) in the vector form.

In the case of error correction using this Galois field GF ($2^r$), one-byte data is treated as an element of the Galois field ($2^r$), and which element (which one-byte data) and how it is faulty is determined. If the data in which $\alpha^2$ should be entered is accidentally given, for example, $\alpha^5$, $\alpha^2 + \alpha^x = \alpha^5$ is given and this $\alpha^x$ is a faulty numerical value. The code length of the above described Reed-Solomon code using this Galois field has the relation of $2^r-1$ and is $2^8-1=255$ bytes at r=8 as shown in FIG. 10. In FIG. 10, the Reed-Solomon code comprises an inspection symbol (ECC part) and an information symbol (data part). The number of inspection symbols (the length of the ECC part) is determined by a generator polynomial of ECC. In this case, the generator polynomial consists of 16 bytes and, in the drawing, low order 16 bytes, that is, position 0~ position 15, form the ECC part. The number of information symbols (the length of the data part) is high order 239 bytes (position 16~ position 254) except for the ECC part. The error correction ability of the ECC is determined according to the generator polynomial and, in this case, the correction ability detects and corrects an error of 8 bytes, that is, up to 8 bytes of 255 bytes.

The procedure for error correction is as described below. First, a syndrome is obtained from all data that have been read. This syndrome is a pattern that shows the details of errors of read data, that is, a position of data where the errors take place and the quantity and/or the pattern of numerical values of the errors at that position. A pattern of error corresponds to the syndrome as 1 vs 1 and, if there are no errors, the syndrome is zero. Then, an error locator polynomial and a error evaluator polynomial are obtained from this syndrome. The Euclidean algorithm is generally used for this purpose. Subsequently, the error positions and erroneous numerical values are obtained based on the error locator polynomial and the error evaluator polynomial obtained above. The method for obtaining the error position and erroneous value, using the error locator polynomial and error evaluator polynomial is executed using the chain search method using the chain algorithm.

How to obtain the syndrome is described later.

The chain search method is first described.

The error locator polynomial $\sigma(x)$ and the error evaluator polynomial $\omega(x)$ obtained using the Euclidean algorithm are expressed as below.

$$\sigma(x)=\sigma_0+\sigma_1 x+\sigma_2 x^2+\ldots+\sigma_n x^n$$

$$\omega(x)=\omega_0+\omega_1 x+\omega_2 x^2+\ldots+\omega_{n-1} x^{n-1}$$

Coefficients $\sigma_0, \sigma_1, \ldots \sigma_n, \omega_0, \omega_1, \ldots \omega_{n-1}$ are known values obtained by the Euclidean algorithm and expressed with the elements of the Galois fields. n denotes the correction ability and n=8 is obtained since the correction cover 8 bytes as described above. Therefore, the above polynomials are as shown below:

$$\sigma(x)=\sigma_0+\sigma_1 x+\sigma_2 x^2+\ldots+\sigma_7 x^7+\sigma_8 x^8$$

$$\omega(x)=\omega_0+\omega_1 x+\omega_2 x^2+\ldots+\omega_7 x^7+\omega_8 x^8.$$

It is known that, in the error locator polynomial $\sigma(x)$, the solution of $\sigma(x)=0$ indicates the error position. When the data at position j1 in position 0 to position 254 in FIG. 10 is faulty, $\sigma(\alpha^{-j1})=0$ is given. Accordingly, it is known that, for obtaining the solution of $\sigma(x)=0$, error position j1 can be obtained by substituting 255 elements of the Galois fields expressed as $x=\alpha^0, \alpha^1, \alpha^2 \ldots \alpha^{254}$ into the error locator polynomial $\alpha(x)$ in sequence and obtaining the element that determines $\sigma(x)=0$ (chain search).

It is known that the error value $e_{j1}$ at that time is obtained from the formula given below.

$$e_{j1}=\alpha^{-j1\cdot 119}\cdot\omega(\alpha^{-j1})/\sigma'(\alpha^{-j1})$$

$\sigma'(x)$ is a formal differential of $\sigma(x)$; for example, if the following is given, $$\sigma(x)=\sigma_0+\sigma_1 x+\sigma_2 x^2+\sigma_3 x^3+\sigma_4 x^4+\sigma_5 x^5.$$

$$\sigma'(x)=\sigma_1\sigma_3 x^2+\sigma_5 x^4$$

is obtained.

The applicant of the present invention has embodied the circuit to obtain the solution of this error locator polynomial $\sigma(x)$ with the circuit previously shown in the drawing. In FIG. 13, the circuit of the error locator polynomial $\sigma(x)$ comprises eight multiplication circuits 11~18, nine flip-flop circuits (hereafter, simply referred to as "FF") 20~28 and an Exclusive OR circuit (hereafter referred to as "EOR circuit") 30. Nine FFs 20~28 are 8-bit FFs into which initial values are respectively entered. For initializing FFs 20~28 ($\sigma_0$, $\sigma_1$~$\sigma_8$), the initializing route shown with a broken line is selected by the selector and FFs 20~28 are connected as shift registers.

When the initial inputs are set byte by byte in the order of $\sigma_8$~$\sigma_4$, the input data are shifted finally up to FF28. Corresponding initial values (coefficients) are set in FFs 20~28, respectively. The initializing route simply serves as a shift register and the data (coefficients) initially set are shifted in sequence to an FF toward FF28 each time one byte is set. After the initial values (coefficients) have been set in FFs 20~28, nothing is set in this initializing route.

Eight multiplication circuits 11~18 respectively have a multiplier value consisting of the Galois field and the multiplier value of the multiplication circuit 11 connected through the operating route shown with a solid line 21 to the FF of coefficient $\sigma_1$ (hereafter referred to as "$\sigma_1$FF"; other FFs to be similarly referred) is $\alpha$. Similarly, the multiplier value of the multiplication circuit 12 of the $\sigma_2$FF22 is $\alpha^2$; the multiplier value of the multiplication circuit 13 of the $\sigma_3$FF23 is $\alpha^3$; the multiplier value of the multiplication circuit 14 of the $\sigma_4$FF24 is $\alpha^4$; the multiplier value of the multiplication circuit 15 of the $\sigma_5$FF25 is $\alpha^5$; the multiplier value of the multiplication circuit 16 of the $\sigma_6$FF26 is $\alpha^6$; the multiplier value of the multiplication circuit 17 of the $\sigma_7$FF27 is $\alpha^7$ and the multiplier value of the multiplication circuit 18 of the $\sigma_8$FF28 is $\alpha$. Operation is executed in the operation routes based on the clock signals. For example, in the $\sigma_8$FF28 and the multiplication circuit (hereafter referred to as "$\sigma_8$ multiplication circuit"; other multiplication circuits to be similarly referred) 18, the value of the $\sigma_8$FF28 after 1 clock is $\sigma_8\cdot\alpha^8$, the value after 2 clock is $\sigma_8\cdot\alpha^8\cdot\alpha^8=\sigma_8\cdot\alpha^{16}$ and the value after t clocks is $\sigma_8\cdot(\alpha^t)^8$.

Similarly, the operation is carried out in other operation routes. In this connection, the values of other FFs 21~27 after t clocks, are $\sigma_1 (\alpha^t)^1$ for $\sigma_1$FF21, $\sigma_2 (\alpha^t)^2$ for $\sigma_2$FF22, $\sigma_3 (\alpha^t)^3$ for $\sigma_3$FF23, $\sigma_4 (\alpha^t)^4$ for $\sigma_4$FF24, $\sigma_5 (\alpha^t)^5$ for $\sigma_5$FF25, $\sigma_6 (\alpha^t)^6$ for $\sigma_6$FF26 and $\sigma_7 (\alpha^t)^7$ for $\sigma_7$FF27.

The values of FFs 21~28 are the values obtained by substituting $\alpha^t$ for x of the error locator polynomial given below $$\sigma(x)=\sigma_0+\sigma_1 x+\sigma_2 x^2+\ldots+\sigma_7 x^7+\sigma_8 x^8$$

that is, the values of the terms given below $$\sigma(\alpha^t)=\sigma_0+\sigma_1(\alpha^t)^1+\sigma_2(\alpha^t)^2+\ldots+\sigma_8(\alpha^t)^8$$

The values when $\alpha^t$ is substituted in the error locator polynomial $\sigma(x)$ can be obtained by adding the values of the terms (values of FFs 20~28) at that time, at the EOR circuit 30.

Accordingly, the value of variable x of the error position polynomial $\sigma(x)$ is substituted and calculated upon each clock in the order of $x=\alpha^1, \alpha^2, \alpha^3, \ldots \alpha^{252}, \alpha^{253}, \alpha^{254}, \alpha^{255}$. The error position j1 is obtained according to t when the solutions of the error locator polynomial obtained in sequence are 0, that is, the EOR circuit 30 is 0.

When $\sigma(\alpha^t)=0$ is given, $\alpha^t=\alpha^{255-j1}$, therefore t=255−j1 and accordingly the error position is j1=255−t. For example, when t=236, j1=255−236=19 is given and this indicates that the data of position 19 is faulty in FIG. 10. In other words, an error position is inspected in sequence from the highest position 254 to the lowest position 0 by carrying out operations in sequence from $\sigma(\alpha^1)$ to $\sigma(\alpha^{255})$ with the clocks (forward search).

Similarly, the erroneous numerical value circuit based on the error evaluator polynomial $\omega(x)$ basically has the same circuit construction.

FIG. 14 shows the circuit of the numerator part of the above described erroneous numerical value $e_{j1}=\alpha^{-j1\cdot 119}\cdot\omega(\alpha^{-j1})/\sigma'(\alpha^{-j1})$, which comprises eight multiplication circuits 31–38, eight FFs 40–47 and the exclusive OR circuit (hereafter referred to as "EOR circuit") 50. Initial setting values (coefficients $\omega_0$–$\omega_7$) are entered into FFs 40–47, respectively. Multiplier values of multiplication circuits 31–38 are $\alpha^{119}$, $\alpha^{120}$–$\alpha^{125}$ and $\alpha^{126}$.

A calculation is repeated with each clock signal and the output of the EOR circuit 50 after t clock signals becomes a value of the numerator of erroneous numerical value $e_{j1}$ as shown below $$\omega_0(\alpha^t)^{119} + \omega_1(\alpha^t)^{120} + \ldots + \omega_7(\alpha^t)^{126} = (\alpha^t)^{119}\omega(\alpha^t)$$

Accordingly, the value of variable x is substituted at each time of the clock signal in the order of $x=\alpha^1, \alpha^2, \alpha^3, \ldots \alpha^{252}, \alpha^{253}, \alpha^{254}, \alpha^{255}$ and the numerator value of the erroneous numerical value ej1 is obtained from the EOR circuit 50.

The following describes a syndrome forming method.

Assuming that the data string of 120 bytes shown in FIG. 12 is the polynomial A (x) and the generator polynomial G (x) of the ECC is $$G(x)=(X-\alpha^{120})(X-\alpha^{121}) \ldots (X-\alpha^{134})(X-\alpha^{135})$$

and the syndrome polynomial S(x) of the data string polynomial A(x) at this time is expressed as a polynomial that has values obtained by substituting $\alpha^{120}, \alpha^{121}, \ldots, \alpha^{135}$ into the polynomial A(x) as the coefficients.

Specifically, when $$S(x)=S_{15}x^{15}+S_{14}X^{14}+\ldots+S_1X+S_0$$

(where, Si=A $(\alpha^{120+i})$, i=0, 1, ... 15)

$$A(x)=A_{119}X^{119}+A_{118}X^{118}+\ldots A_2X^2+A_1X+A_0$$

is given, $$SO=A(\alpha^{120})=A_{119}\alpha^{120*119}+A_{118}\alpha^{120*118}+\ldots+A_2\alpha^{120*2}+A_1\alpha^{120}A_0$$

is obtained.

FIG. 15 shows the syndrome generating circuit for the above ECC that comprises 16 flip-flop circuits (hereafter referred to as "FF") 210–225 and 16 multiplication circuits 230–245 having the EOR matrix for multiplying input values by $\alpha^i$. 16 FFs 210–225 are 8-bit FFs and the initial values are 0.

On the other hand, 16 multiplication circuits 230–245 have the multiplier values respectively consisting of the Galois fields. The multiplier value of multiplication circuit 230 connected to FF210 through the operation route is $\alpha^{120}$, the multiplier value of multiplication circuit 231 connected to FF211 through the operation route is $\alpha^{121}$, the multiplier value of multiplication circuit 232 connected to FF212 through the operation route is $\alpha^{122}$, the multiplier value of multiplication circuit 233 connected to FF213 is $\alpha^{123}$, and similarly the multiplier values of multiplication circuits 234–245 corresponding to $\alpha^{124}$–$\alpha^{135}$ are set in advance.

Under these conditions, values $A_{119}, A_{118}, A_{117}, \ldots, A_2, A_1$ and $A_0$ at positions 119–0 of data of 120 bytes shown in FIG. 12 are entered into 16 operation routes comprising FFs and multiplication circuits in sequence starting from the value of the high order position, that is, $A_{119}$.

In the operation route that comprises, for example, FF210 and the multiplication circuit 230 providing multiplier value $\alpha^{120}$, the output at the time of the first clock signal $A_{119}$. Subsequently, at the second clock signal, $A_{119}\ \alpha^{120}+A_{118}$(+ denotes the exclusive OR as in the following expressions)

at the third clock signal, $$A_{119}(\alpha^{120})^2+A_{118}\alpha^{120}+A_{117}$$

and at the 120th clock signal, $$A_{119}\alpha^{120*119}+A_{118}\alpha^{120*118}+\ldots+A_2\alpha^{120*2}+A_1\alpha^{120}+A_0$$

In other words, the above means that, in the operation route that comprises FF210 and the multiplication circuit 230 providing multiplier value $\alpha^{121}$, $SO=A(\alpha^{120})$ is obtained.

Similarly, in the operation route that comprises FF211 and the multiplication circuit 231 providing multiplier value $\alpha^{121}$, the output at the 120th clock signal is as shown below, $$A_{119}\alpha^{121*119}+A_{118}\alpha^{121*118}+\ldots+A_2\alpha^{121*2}A_1\alpha^{121}+A_0$$

and this means that $S1=A(\alpha^{121})$ is obtained.

Incidentally, in the operation route that comprises FF225 and the multiplication circuit 245 providing multiplier value $\alpha^{135}$, the output at the 120th clock signal is as shown below, $$A_{119}\alpha^{135*119}+A_{118}\alpha^{135*118}+\ldots+A_2\alpha^{135*2}+A_1\alpha^{135}+A_0$$

and this means that $S15=A(\alpha^{135})$ is obtained.

Specifically, coefficients A $(\alpha^i)$ (i=120, 122, ..., 135) of the syndrome polynomial are generated at the timing of the 120th clock signal from 16 operation routes each comprising an FF and a multiplication circuit.

As described above, the error locator polynomial and the error evaluator polynomial are obtained based on the syndromes of the above polynomials A (x), and which byte (position) and how it is faulty can be known according to the error locator polynomial and the error evaluator polynomial. The chain algorithm is used as a method for obtaining the error position by using the error locator polynomial and the error evaluator polynomial (chain search). In addition, the applicant of the present invention has proposed a circuit for simultaneously generating the CRC syndrome in the chain search, which speeds up the error correction processing. (Refer to Patent Application 1991-34790.)

The prior art related to the present invention described above is described in detail in "Essentials of Error Correction Coding Technology" the electronics essentials series No. 20 published by Japan Industrial Technology Center (published on Mar. 20, 1986). It is recommended to refer to the descriptions of this reference literature.

Similarly in an optical disk in which the code length of one interleave is 120 bytes and the number of information symbols is 120 bytes as shown in FIG. 11, the same operations are carried out in the circuit as shown in FIG. 13.

However, the data of the optical disk is processed in 255 bytes as shown in FIG. 10 and therefore the error position is inspected (forward chain search) in sequence from the highest position 254 to the lowest position 0 by supplying clock signals in the circuit of the error locator polynomial $\sigma$ (x) and carrying out calculations in sequence from $\sigma(\alpha^0)$ to $\sigma(\alpha^{255})$ and the processing time is wasted. In other words, in the case of the code length of 120 bytes smaller than 255 bytes, error correction processing is executed including effective data from position 119 to position 0 after "0" has been entered into high order positions 254 to 120 and unnecessary processing with unnecessary data has been carried out, and therefore the circuit of the error locator polynomial $\sigma$ (x) from position 254 to position 120 carries out wasteful processing (chain search). This is the same with the circuit for processing erroneous numerical values shown in FIG. 14.

SUMMARY OF THE INVENTION

An object of the present invention made so as to solve the above described problems is to provide a processing method in an error correction processor capable of speeding up a chain search without increasing the amount of hardware and reducing the correction processing time, more particularly, providing a syndrome generating system capable of generating a syndrome of a syndrome polynomial that can be adapted to a processing method in a new error correction processor and a syndrome generating method thereof.

The present invention adopts the basic technological configuration as stated below to achieve the above described object. Specifically, a system for correcting and processing errors of data formed with coded words consisting of the Galois fields (finite fields) in reading the data from a specified recording medium is an error correction processor that comprises an error locator polynomial generating means for processing a syndrome from all codes of the data and generating an error position detection polynomial and an error evaluator polynomial defined in the present invention, an error detection means for calculating an error position related to the recorded data and an erroneous value at the error position from these polynomials, and a correction means for correcting and processing appropriate recorded data according to the error position and the erroneous value obtained from the above calculations, wherein at least the error detection polynomial generating means and the processing means in the error detection means are adapted to carry out processing so that the information is obtained in sequence from low order information to high order information; the error correction processor is provided with a cyclic redundancy check code generating means for calculating a syndrome from recorded data that has been corrected and processed and generating the cyclic redundancy check code (CRC) defined in the present invention to detect whether or not the correction of the error position of the recorded data that has been corrected and processed by the correction means is appropriate and the processing means is adapted to carry out processing so as to obtain information in sequence from low order information to high order information of the recorded data.

The processing means of the error position and erroneous value generating means of the error correction processor is also constructed to carry out processing so that the information can be obtained in sequence from information of the low order positions to information of the high order positions.

In addition, the present invention provides a processing method for a position, where an error is to be corrected, that is adapted to obtain in sequence the solutions to calculations in the operation circuits corresponding to low order positions to high order positions of the above read data in an error correction processor in which the operation circuits for respectively obtaining the solutions corresponding to each one of the terms of an error locator polynomial are provided and the coefficient values of which comprising the elements read out from a recording medium, and generated from the data of coded words comprising the Galois fields (finite fields), and each of the operation circuits processing to obtain a value of each one of the terms corresponding to respective variable values comprising the galois fields in sequence synchronized with clock signals and adding the values of the terms from the operation circuits for the terms in the adding circuits, to obtain a solution of the error locator polynomial, and an error at each position of the data is detected based on the solutions. The present invention also provides a syndrome generating method for use in an error correction processor that is adapted to output a syndrome by entering all elements of the above described data in sequence from low order positions to high order positions in the error correction processor in which a syndrome generating circuit is provided for generating a syndrome polynomial for which the elements read out from a recording medium are generated from the data of coded words comprising the Galois fields (finite fields), and in which the coefficients of the syndrome polynomial are the elements of the above described data; the solutions of the cyclic redundancy code generating polynomials of the above described data, are substituted for the variables of the terms of the syndrome polynomial, synchronized with clock signals and the above described coefficients are applied to the terms of the polynomial, and wherein a syndrome of the syndrome polynomial in the solution of the syndrome generator polynomial, is output when all of the elements of the above data are entered as the coefficients of the corresponding terms in the syndrome generating circuit synchronized with the clock signals.

BRIEF DESCRIPTION OF THE DRAWINGS

FIGS. 7, 7A, and 7B are block diagrams showing a configuration example of an error correction processor in accordance with the present invention, FIGS. 8A, 8B, 8C, 8D, and 8E are diagrams showing an example of structure and arrangement of data used in the optical disk.

BEST MODE FOR CARRYING OUT THE INVENTION

A practical example of a register circuit related to the present invention is described in detail below, referring to the accompanying drawings.

Figure 1:
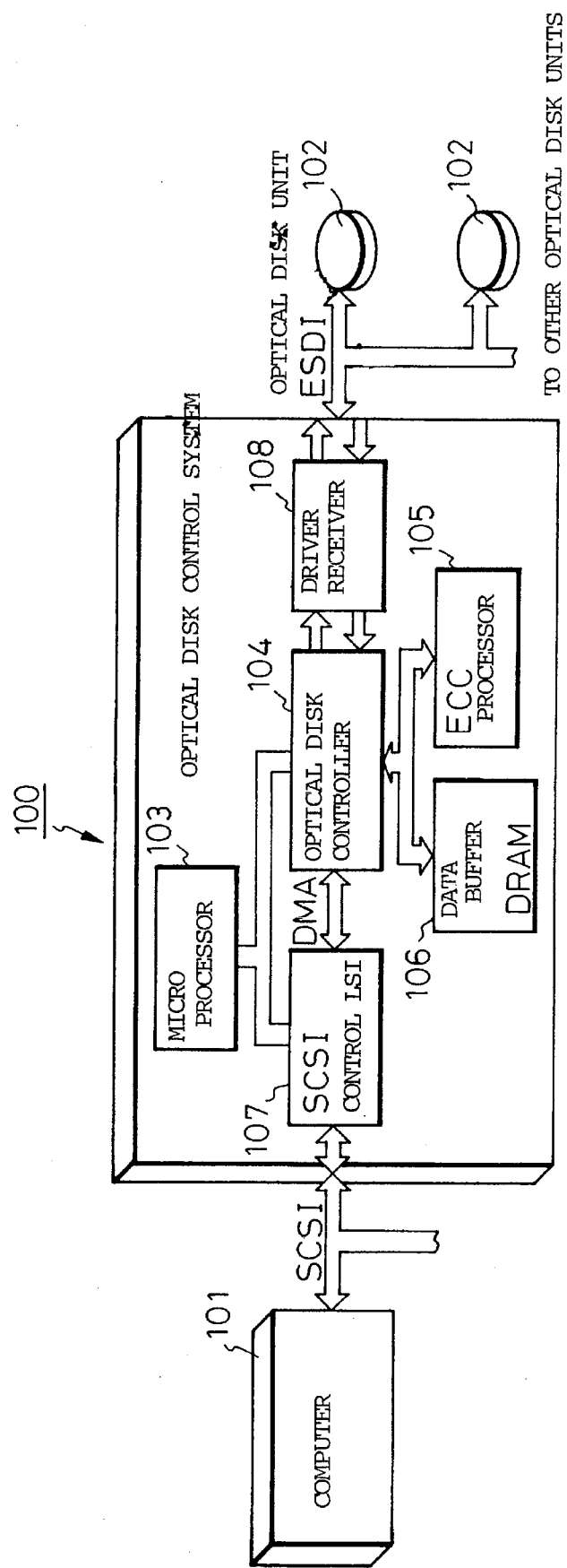
FIG. 1 is an overall configuration diagram of an optical disk control system in which the present invention is embodied.

FIG. 1 shows the overall configuration of an embodiment of an optical disk control system to which an error correction processor in accordance with the present invention applies. The optical disk control system 100 is connected to a computer 101 through an interface SCSI (Small Computer System Interface) and to optical disk units 102 through an interface modified ESDI (Enhanced Small Drive Interface). The optical disk control system 100 comprises a host MPU (micro processor) 103 as an optical disk control LSI, an optical disk controller 104, an ECC processor 105, a data buffer 106 comprising a DRAM, an SCSI control LSI 107 and a driver receiver 108.

The optical disk controller 104 and the ECC processor 105 carry out (1) the transmission of instructions to optical disk units 102 and reception of statuses, (2) formatting of data to be recorded in the optical disks, (3) decoding the formats of data read out from the optical disk and error correction, (4) data transfer between optical disks 102 and the data buffer 106 and (5) data transfer between the SCSI control LSI 107 and the data buffer 106.

Figure 2:
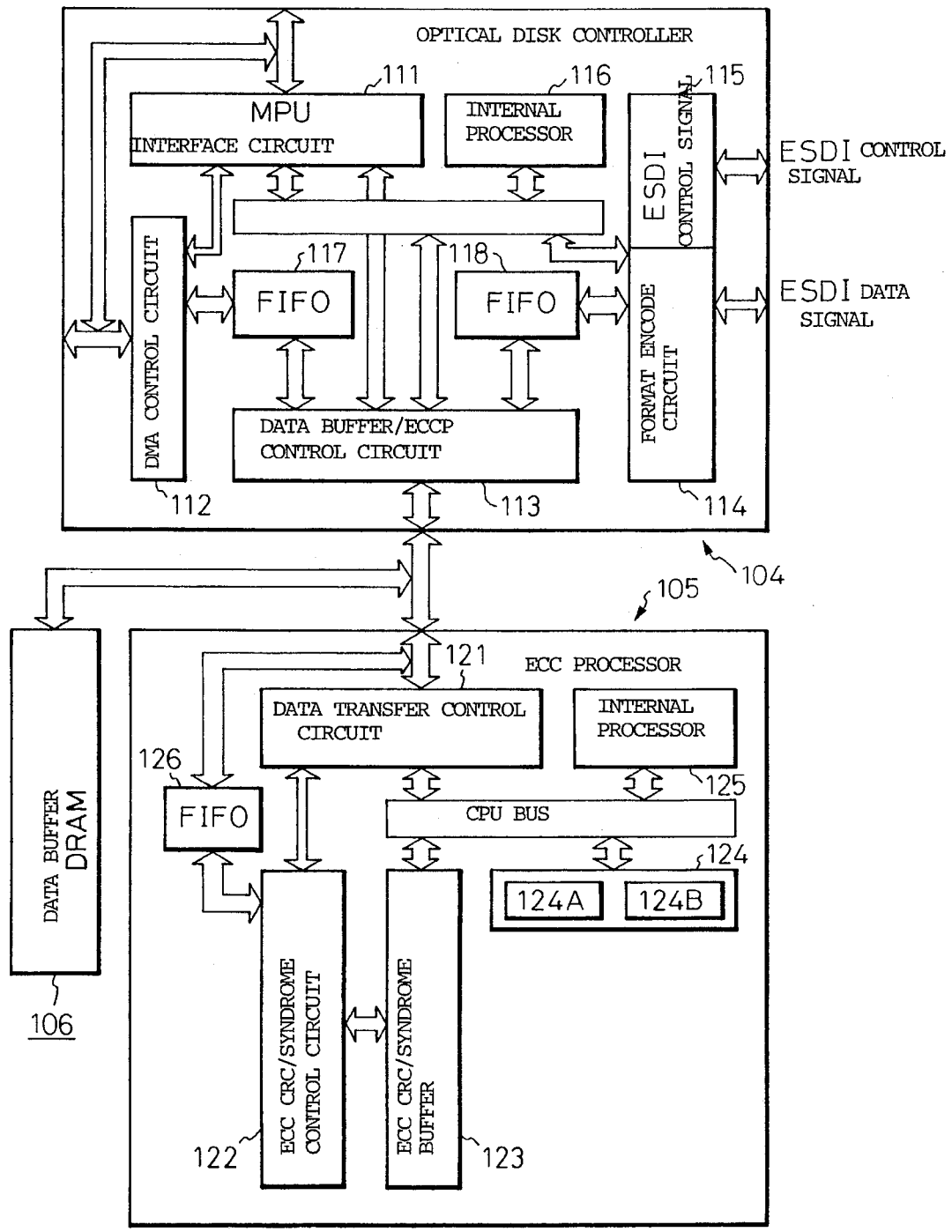
FIG. 2 is a block diagram showing an electrical configuration of an optical disk controller and an ECC processor.

As shown in FIG. 2, the optical disk controller 104 comprises the MPU interface 111, DMA control circuit 112, data buffer/ECCP control circuit 113, format encode/decode circuit 114, ESDI control circuit 115, internal processor 116 and FIFO memories 117 and 118. The MPU interface 111 transmits and receives the commands and the results of processing through the host MPU 103 and the MPU interface 111. The MPU interface 111 incorporates a memory for storing parameters necessary for the execution of commands and the data is transferred through this MPU interface 111 in read/write operations of the contents of the data buffer 106 from the MPU 103.

The DMA control circuit 112 controls DMA transfer through the SCSI control LSI 107 and the DMA interface and, specifically, carries out the handshake control and the byte count control of DMA transfer as the DMA bus master. The data buffer/ECCP control circuit 113 controls transmission and reception of data through the data buffer 106, ECC processor 105 and data buffer/ECC interface and further controls read/write and refresh operations of the data buffer DRAM and transmission and reception of data to/from the ECC processor 105. In addition the data buffer/ECCP control circuit 113 carries out arbitration of the access requests to the data buffer/ECC processor from the host MPU 103, DMA control circuit 112, format encode/decode circuit 114, ESDI control circuit 115 and internal processor 116 and time sharing control of the data buffer bus.

The format encode/decode circuit 114 carries out parallel and serial conversion of data to be recorded in an optical disk and modulation of the data to RLL (2.7) code and transmits the data to the ESDI after having added a sync or resync pattern to it. In addition, the format encode/decode circuit 114 decodes the data pattern in reading data from the optical disk, separates the sync or resync pattern from data and carries out demodulation and serial/parallel conversion of data.

The ESDI control circuit 115 has registers for transmission and reception of ESDI control signals and the interface failure detection circuit and the internal processor 116 controls transmission of codes to the optical disk units 102 and reception of statuses through this control circuit 115. The internal processor 116 decodes the commands supplied from the host MPU 103, reports the results of processing and controls continuous and independent processing of a plurality of sectors. In addition, the internal processor 116 generates the commands to the ECC processor 105, receives and analyzes the results of processing and carries out error correction of data in the data buffer.

On the other hand, the ECC processor 105 comprises a data transfer control circuit 121, and ECC/syndrome calculation circuit 122, an ECC/syndrome buffer 123, an error position/erroneous value detection circuit 124, an internal processor 125, and an FIFO memory 126. The data transfer control circuit 121 carries out transmission and reception of the commands and the results of processing through the optical disk controller 104 and the optical disk controller interface and controls data transfer between the ECC/syndrome calculation circuit 122 and the external data buffer 106.

The ECC/syndrome calculation circuit 122 carries out calculation of the ECC and the syndrome carries out a CRC (cyclic redundancy check) and an ECC calculation in writing data into the optical disk. The calculation circuit 122 carries out an error syndrome calculation and a CRC data calculation when data is read from the optical disk. The ECC/syndrome buffer 123 is a buffer memory for temporarily storing an ECC/syndrome made in the ECC/syndrome calculation circuit 122 and is capable of storing enough ECCs and syndromes for two sectors.

The error position/erroneous value detection circuit 124 is for detecting an error position and an erroneous value based on a syndrome when data is read out from the optical disk and comprises a polynomial coefficient calculating circuit 124A and an error position/erroneous value detection circuit 124B for obtaining coefficients $\sigma_o$–$\sigma_8$ and $\omega_0$–$\omega_7$ of the error locator polynomial $\sigma(x)$ and the error evaluator polynomial $\omega(x)$ based on the Euclidean algorithm. The internal processor 125 decodes the commands supplied from the optical disk controller 104, reports the results of processing and transfers processed data in the ECC processor 105.

When data to be entered into the optical disk is transferred from the computer 101 through the SCSI control LSI 107, the optical disk control system 100 constructed as described above temporarily stores the data in the data buffer 106, takes out as much data as required and writes it in the optical disk unit 102 while processing it in the optical disk controller 104. The optical disk control system 100 temporarily stores data read out from the optical disk unit 102 in the data buffer 106, and lump-transfers it to the SCSI control LSI 107 when a certain amount of data is stored.

Since the error rate of the optical disk is extremely high, the ECC processor 105 adds the error check code ECC to the data to be written so that errors can be corrected later, detects the error position and the error mode based on the ECC when reading out the data, and corrects the erroneous part in the data buffer 106. The optical disk controller 104 and the ECC processor 105 have, respectively, the internal processors 116 and 126 in which all operations are controlled according to a program. The optical disk control system 100 as a whole, including the optical disk controller 104 and the ECC processor 105, is controlled according to a program by the host MPU 103. Therefore, the optical disk controller 104 is provided with the MPU interface to communicate the instructions and the results of processing with the host MPU 103 and the internal processor 115 decodes the instruction supplied through the MPU interface, for example, to actuate the data buffer/ECCP control circuit 113 or start the ECCP processor 125.

The ECC processor 105 operates with an instruction from the optical disk controller 104, receives data on the bus connecting the ECCP control circuit 113 and the data buffer 106, generates the ECC and calculates a syndrome to obtain the error position and the erroneous value when reading the data.

Figure 3:
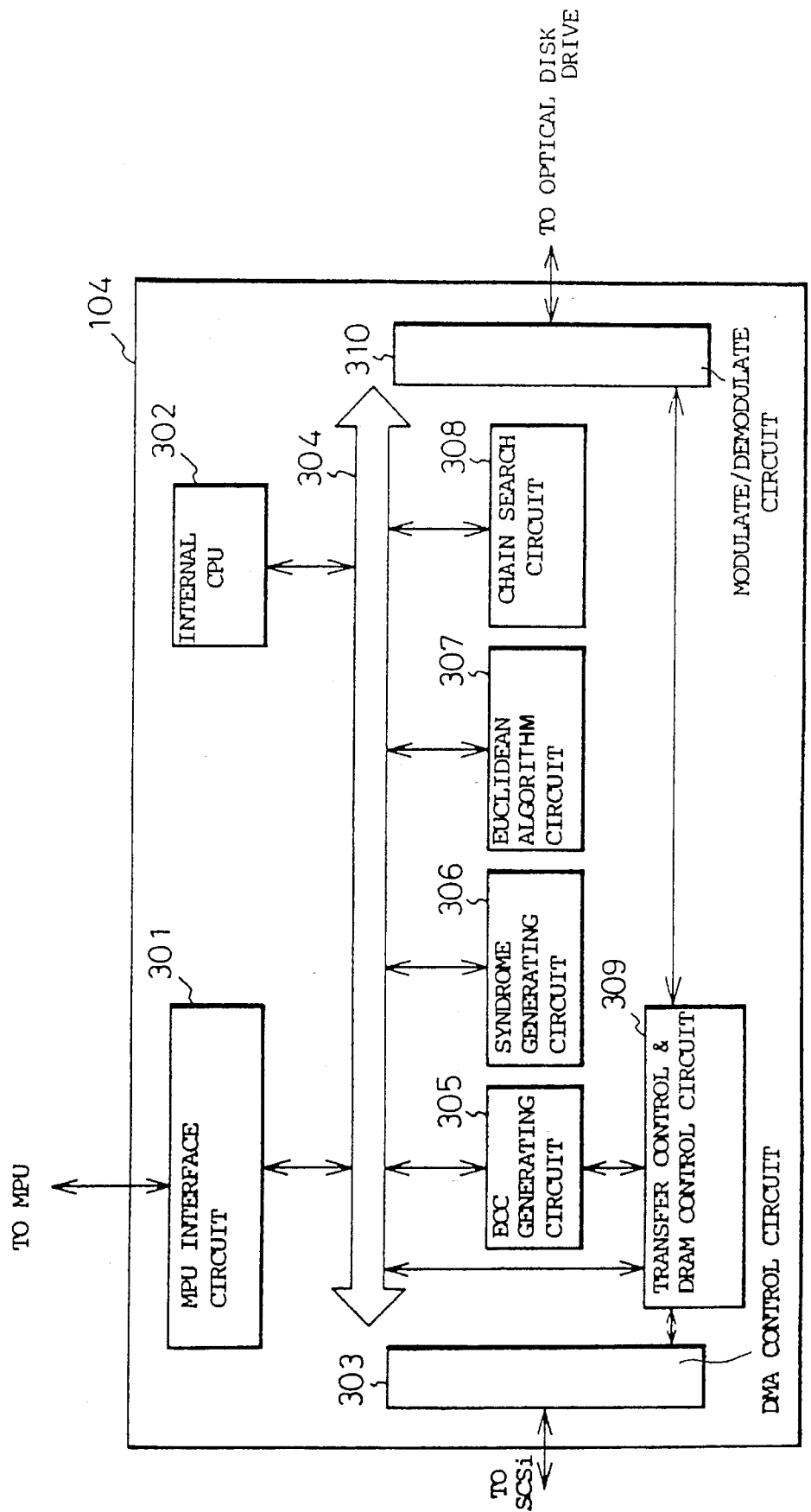
FIG. 3 is a rough block diagram showing an example of the configuration of the optical disk controller.

FIG. 3 illustrates an example of the internal configuration of the optical disk controller 104. The MPU interface circuit 301 connected to the microprocessor 103 and the internal calculation circuit (CPU) 302 are connected to the internal bus line 304, and the ECC generating circuit 305, syndrome generating circuit 306, Euclidean algorithm circuit 307, chain search circuit 308 are also connected to the internal bus line 304. The transfer control and DRAM control circuit 309 is connected to the ECC generating circuit 305 and the syndrome generating circuit 306.

The transfer control and DRAM control circuit 309 is constructed to be connected to the DRAM control circuit 303 connected with the SCSI control circuit 107 and the modulation/demodulation circuit 310 connected with the optical disk drive 102.

The following describes the error position and erroneous value detection circuit 124B related to the present invention.

Figure 4:
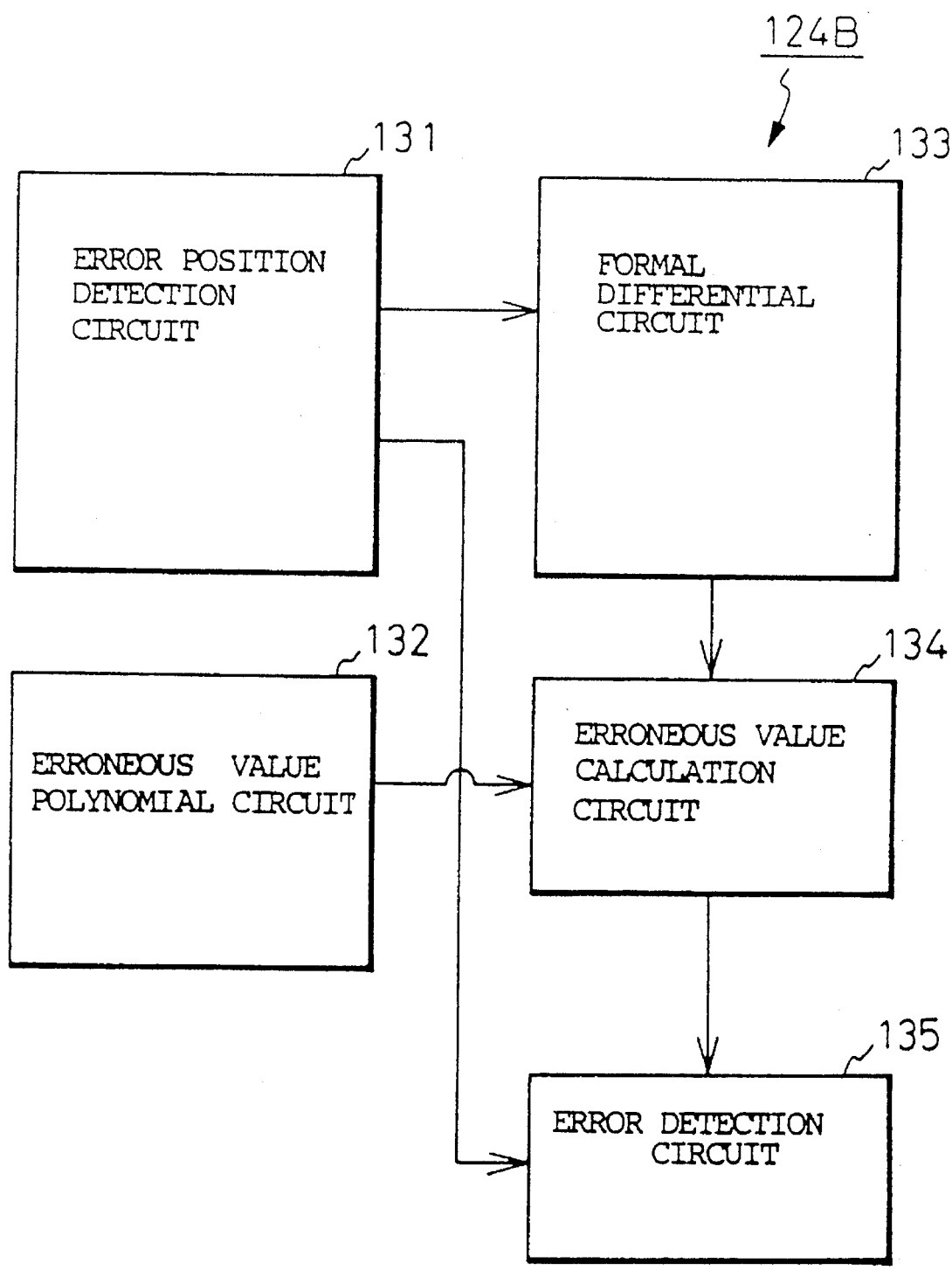
FIG. 4 is a block circuit diagram showing an electrical configuration of the error position/erroneous value detection circuit 124B in FIG. 2.

In FIG. 4, the error position and erroneous value detection circuit 124B using the chain search method comprises an error locator detection circuit 131, error evaluator polynomial circuit 132, formal differentiation circuit 133, erroneous value calculation circuit 134 and error detection circuit 135. In the error position detection circuit 131 and the error evaluator polynomial circuit 132, coefficients $\sigma_0 \sim \sigma_8$ and $\omega_0 \sim \omega_7$ obtained according to the Euclidean algorithm are set with the initial setting input signals to obtain the solution $\sigma$ ($\alpha^{-j1}$) of the error locator polynomial and the solution $\alpha^{-j1 \cdot 119} \cdot \omega(\alpha^{-j1})$ of the numerator of the erroneous value $e_{j1}$ for each clock signal. The error position detection circuit 131 detects whether the solution $\sigma$ ($\alpha^{-j1}$) of the error locator polynomial is zero or the error position is obtained and, if the solution is zero, outputs the zero detection signal to the error detection circuit 135. The formal differentiation circuit 133. For the formal differentiation circuit 133, the denominator of erroneous value $e_{j1}$, that is, the coefficient of formal differential $\sigma'$ (x) of the error locator polynomial $\sigma$ (x) is initialized to obtain the solution $\sigma'$ ($\alpha^{-j1}$) of the formal differential for each clock signal.

The erroneous value calculation circuit 134 enters the solution $\alpha^{-j1 \cdot 119} \cdot \omega$ ($\alpha^{-j1}$) of the numerator of the erroneous value $e_{j1}$ from the error evaluator polynomial circuit 132 and the denominator of the erroneous value $e^{j1}$ from the formal differentiation circuit 133, that is, the solution $\sigma'$ ($\alpha^{-j1}$) of the formal differential and calculates the erroneous value $e_{j1}$. The erroneous value calculation circuit 134 practises the division by multiplying the solution $\alpha^{-j1 \cdot 119} \cdot \omega$ ($\alpha^{-j1}$) by a reciprocal of the solution $\sigma'$ ($\alpha^{-j1}$) and is therefore provided with multiplication units for the Galois field reciprocal ROM and the Galois field GF ($2^8$). The error detection circuit 135 is provided with an error position counter register file, etc., stores the number of clock signals, that is, a value of the error position counter based on a zero detection signal from the error position detection circuit 135 and further stores an erroneous value $e_{j1}$ calculated by the erroneous value calculation circuit 134 for the error position at that time into the register file. In addition, the error detection circuit 135 is provided with the error counter to count the number of errors in accordance with the zero detection signals.

The following paragraphs describe in detail the error locator detection circuit 131 and the error evaluator polynomial circuit 132.

Figure 5:
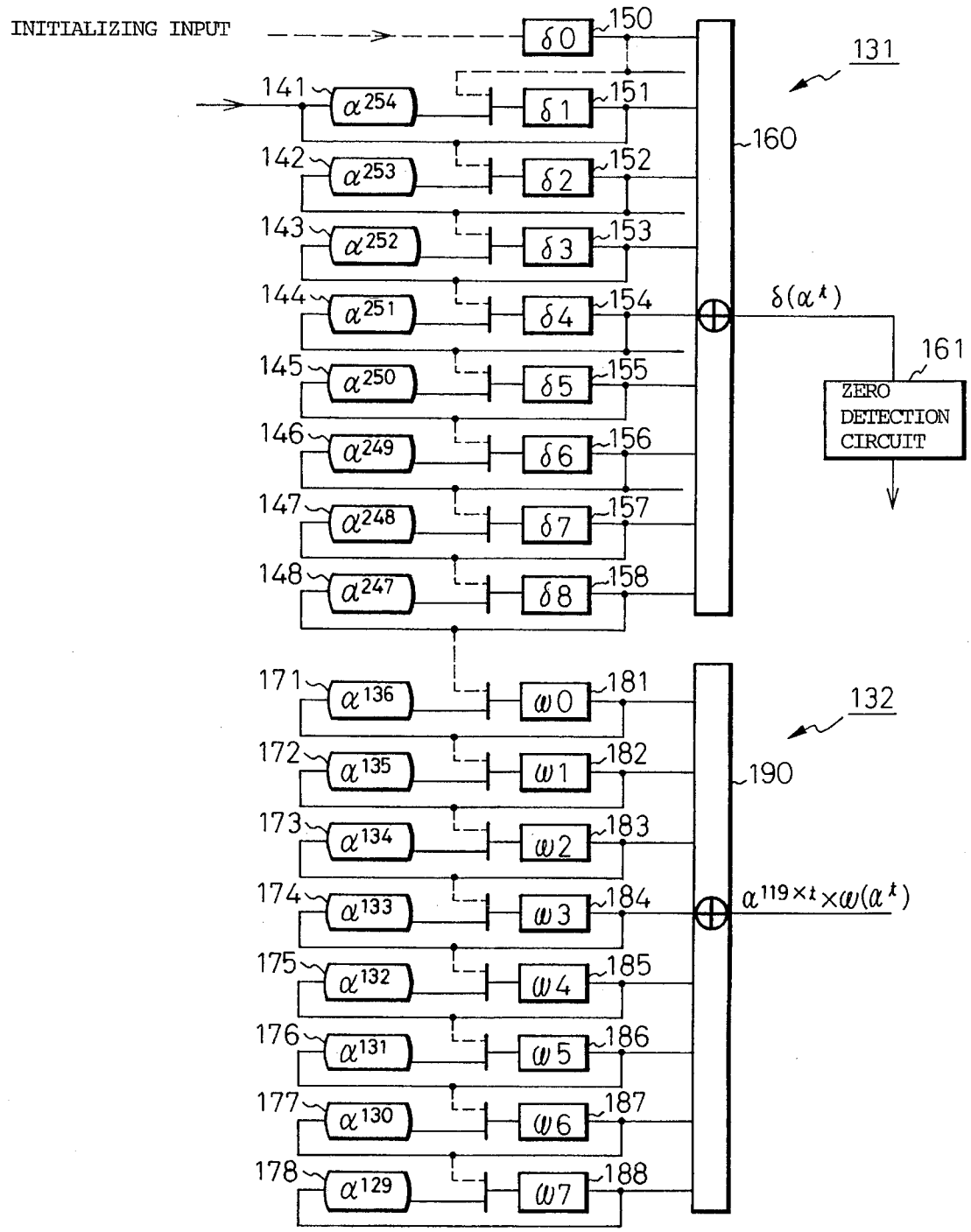
FIG. 5 is a block diagram showing an example of an error position detection circuit and an erroneous value polynomial circuit in accordance with the present invention.

FIG. 5 shows the principal block circuit of the error locator detection circuit 131 and the error evaluator polynomial circuit 132 and the error position detection circuit 131 comprises eight multiplication circuits 141~148, nine FFs 150~158, EOR circuit 160 and zero detection circuit 161. The erroneous value polynomial circuit 132 comprises eight multiplication circuits 171~178, eight FFs 181~188 and EOR circuit 190.

FFs 150~158 and 181~188 are 8-bit FFS and coefficients $\sigma_0 \sim \sigma_8$ are initialized in FFs 150~158 and coefficients $\omega_0 \sim \omega_7$, in FFs 181~188. For initialization, an initializing route is selected with a selector and FFs 150~158 and 181~188 are connected as shift registers. When the initializing input is set byte by byte in sequence, it is shifted in sequence and finally set in the FF187. Corresponding initial values (coefficients) are set in FFs 150~158 and 181~188, respectively. The initializing route serves as a mere shift register and the data (coefficient) initially set is shifted down in sequence to FFs at the FF 18 side each time one byte is set. In this initializing route, the initial values (coefficients) $\sigma_0 \sim \sigma_8$, $\omega_0 \sim \omega_7$) are set in FF 150~188.

Multiplication circuits 141~148 of the error position detection circuit 131 respectively have a multiplier value comprising the Galois field and the multiplier value of the multiplication circuit 141 connected to the FF 151 with coefficient $\sigma_1$ (hereafter referred to as "$\sigma$FF"; others to be similarly referred) is $\alpha^{254}$ (=$\alpha^{255-1}$). Similarly, the multiplier value of multiplication circuit 142 of $\sigma_2$ FF152 is $\alpha^{253}$ (=$\alpha^{255-2}$); the multiplier value of multiplication circuit 143 of $\sigma_3$ FF153 is $\alpha^{252}$ (=$\alpha^{255-3}$); the multiplier value of multiplication circuit 144 of $\sigma_5$ FF 154 is $\alpha^{251}$ (=$\alpha^{255-5}$); the multiplier value of multiplication circuit 146 of $\sigma_6$ FF 156 is $\alpha^{249}$ (=$\alpha^{255-6}$); the multiplier value of multiplication circuit 147 of $\sigma_7$ FF 157 is $\alpha^{248}$ (=$\alpha^{255-7}$) and the multiplier value of multiplication circuit 148 of $\pi_7$ FF 158 is $\alpha^{257}$ (=$\alpha^{255-8}$).

In other words, the error position detection polynomial generating circuit of an error detection polynomial generating means comprises a multiplication circuit part that comprises the multiplication circuit 141 having multiplier values that comprise Galois fields and the flip-flop (FF) circuit 151 that incorporates variable value $\sigma$1 corresponding to the coefficients of the terms that form a generator polynomial of the error position detection polynomial or error evaluator polynomial, a group of multiplication circuits (comprising multiplication circuits 141~148 and flip-flop (FF) circuits 151~158 that are formed with a plurality of the above described multiplication circuit parts arrayed in parallel formation, the exclusive OR (EOR) circuit connected to the outputs of respective multiplication circuits of the group of multiplication circuits and the shift register circuit. The polynomial generating circuit sets the multiplier values of the multiplication circuits into which the variables are entered with the first clock signal among a plurality of multiplication circuit in variables $\alpha^{254}$ comprising higher dimension Galois fields and subsequently sets the multiplier values of other multiplication circuits in variables $\alpha^{254}$, $\alpha^{253}$, $\alpha^{252}$ . . . $\alpha^{247}$ comprising lower dimension Galois fields in the order of arrays.

For example, therefore, the value of $\sigma_8$ FF158 after t clock signals if $\sigma_8$ ($\alpha^{255-t})^8$. Consequently, when $\sigma$ ($\alpha^{255-t}$)=0, $\alpha^{255-t}=\alpha^{-j1}=\alpha^{255-j1}$ and t=j1 are obtained according to $\sigma$ ($\alpha^{-jt}$), and the error position is jl=t.

In this connection, the values of other FFs 151~157 after t clocks are $\sigma_1$ ($\alpha^{255-t})^1$ for $\sigma_1$ FF151, $\sigma_2$ ($\alpha^{255-t})^2$ for $\sigma_2$ FF152, $\sigma_3$ ($\alpha^{255-t})^3$ for $\sigma_3$ FF153, $\sigma_4$ ($\alpha^{255-t})^4$ for $\sigma_4$ FF154, $\sigma_5$ ($\alpha^{255-t})^5$ for $\sigma_5$ FF155, $\sigma_6$ ($\alpha^{255-t})^6$ for $\sigma_6$ FF156 and $\sigma_7$ ($\alpha^{255-t})^7$ for $\sigma_7$ FF157.

Accordingly, then t=1, $$\sigma(\alpha^{254})=\sigma+\sigma_1(\alpha^{254})^1 + \ldots + \sigma_8(\alpha^{254})^8,$$

when t=2, $$\sigma(\alpha^{253})=\sigma_0+\sigma_1(\alpha^{253})^1 + \ldots + \sigma_8(\alpha^{253})^8,$$

and when t=255, $$\sigma(\alpha^0)=\sigma_0+\sigma_1(\alpha^0)^1 + \ldots + \sigma_8(\alpha^0)^8,$$

Figure 10:
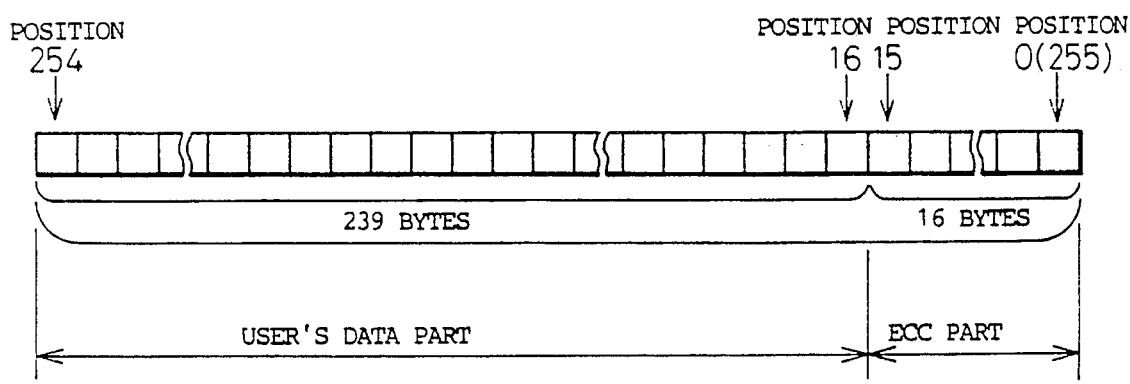
FIG. 10 is a diagram of the Reed Solomon coded word; the code length of which is 255 bytes.

Specifically, the multiplier values of the multiplying units are determined so that the value of variable x of the error locator polynomial $\sigma(x)$ are substituted in the order of $x=\alpha^{254}, \alpha^{253}, \alpha^{252} \ldots \alpha^2, \alpha^1, \alpha^0$ and calculations from $\sigma(\alpha^{254})$ to $\sigma(\alpha^0)$ are carried out in sequence each time the clock signal is given and, in FIG. 10, an error position from position 0 to position 254 is inspected.

Figure 11:
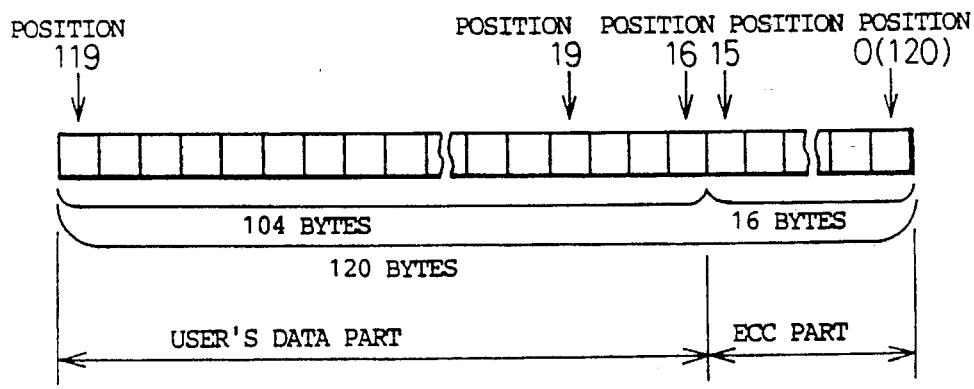
FIG. 11 is a diagram of the Reed Solomon coded word; the code length of which is 120 bytes.
Figure 12:
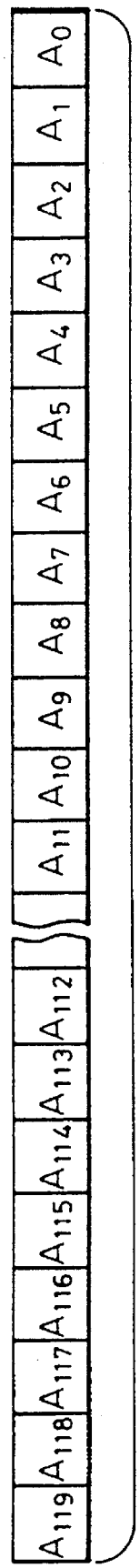
FIG. 12 is a diagram illustrating the conventional data string to be read.
Figure 13:
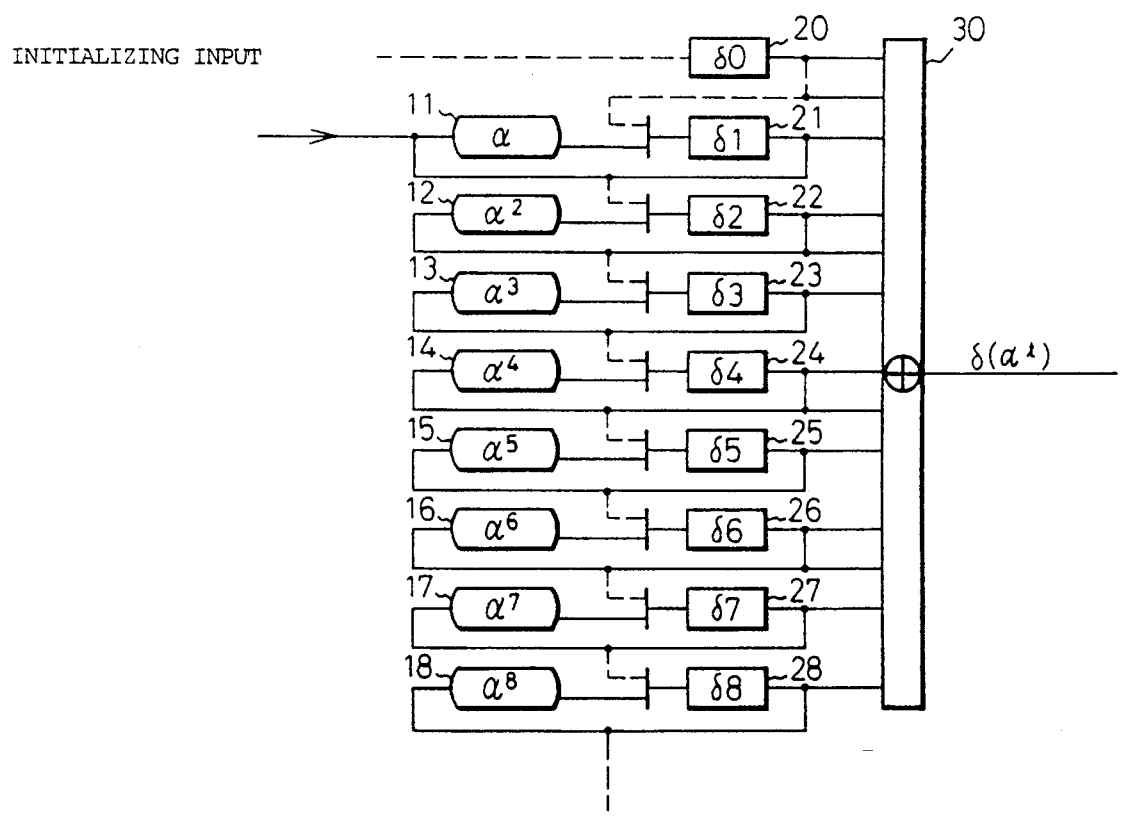
FIG. 13 is a circuit diagram showing an example structure of the conventional error locator polynomial.
Figure 14:
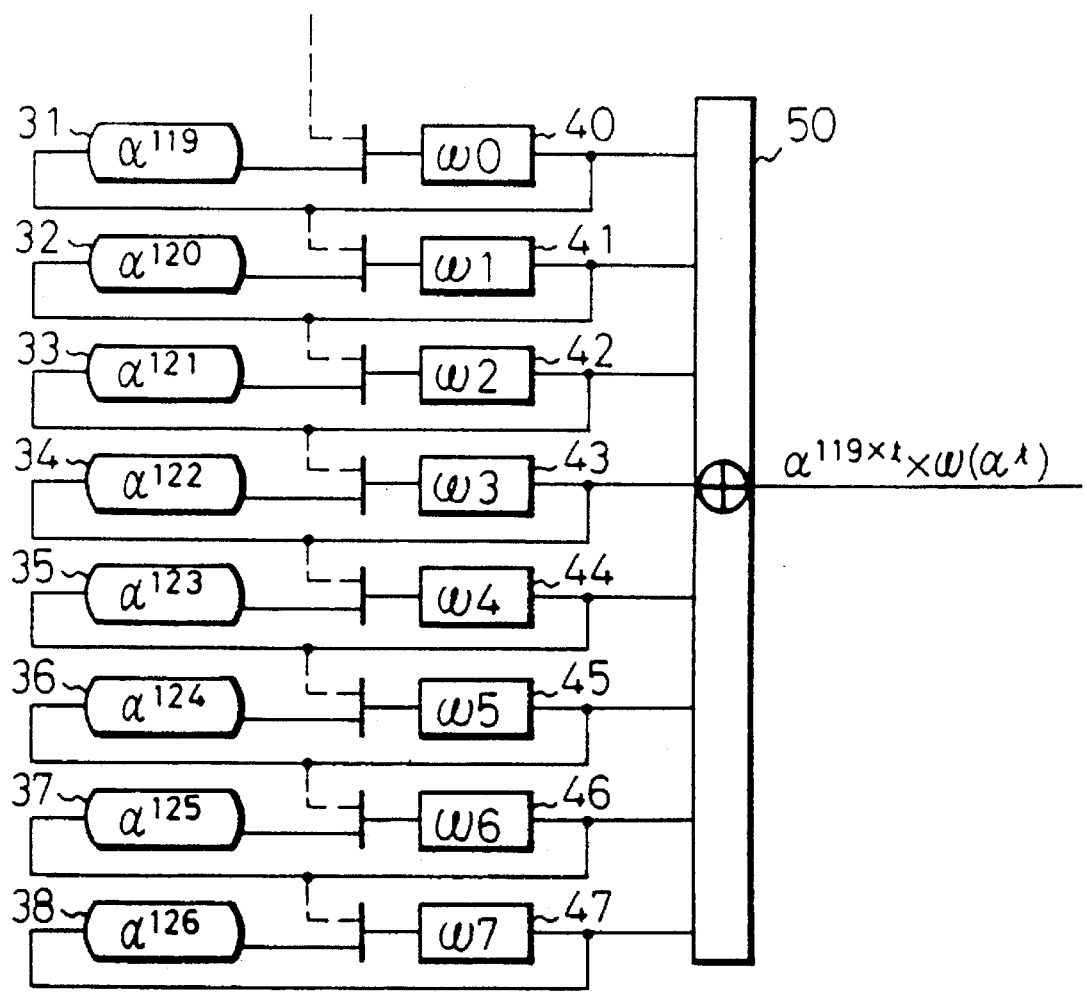
FIG. 14 is a circuit diagram showing an example structure of the conventional error evaluator value polynomial.
Figure 15:
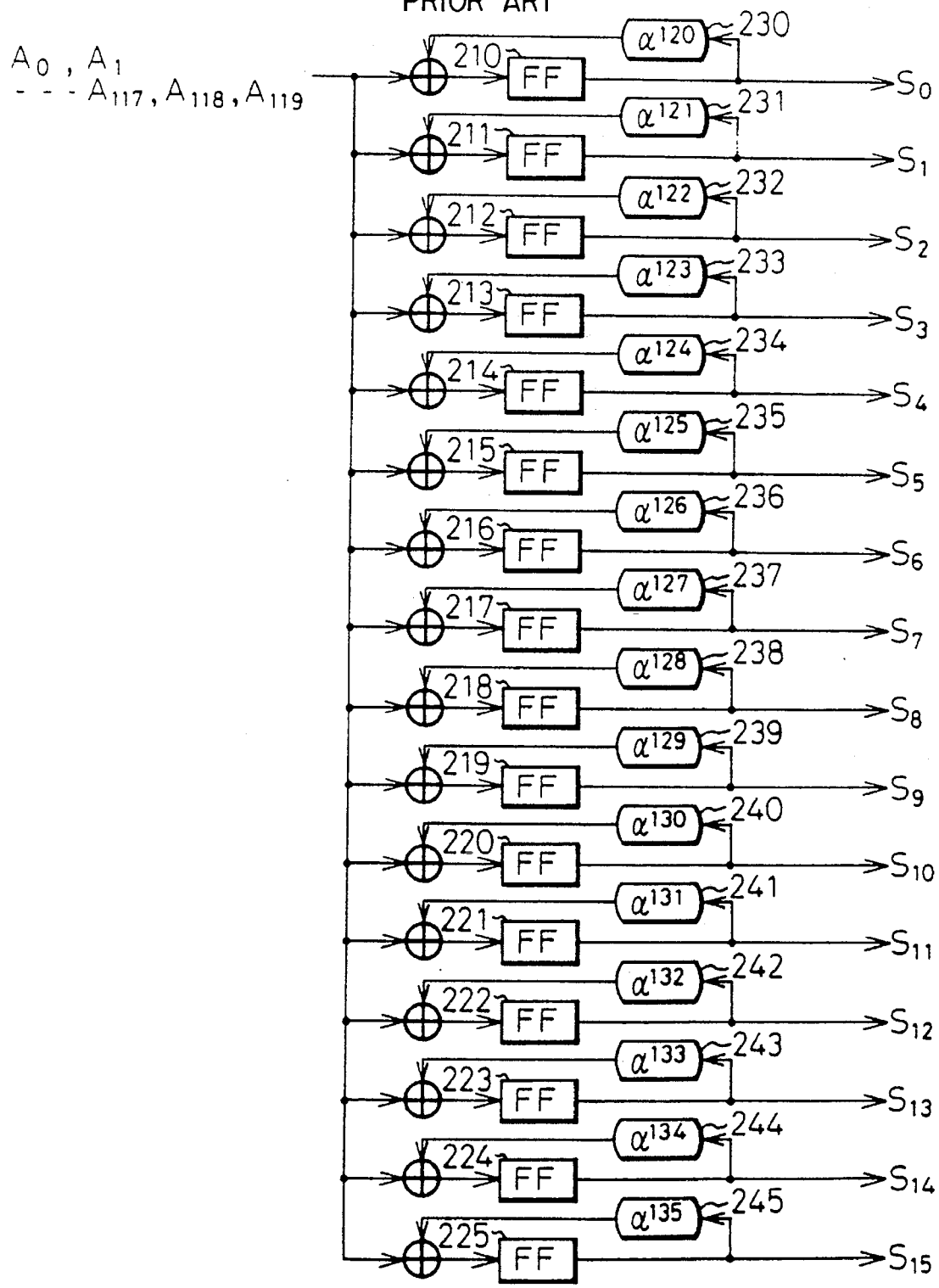
FIG. 15 is a block diagram showing an example structure of the conventional syndrome generating circuit.

Even in case of the Reed-Solomon coded word with the code length of 120 bytes smaller than 255 bytes as shown in FIG. 11, the error position is checked in sequence from position 0 and therefore unnecessary processing for position 254 to position 120 as observed in the conventional detection, which has been carried out in sequence from position 254, is eliminated and the error position detection processing can be immediately carried out.

On the other hand, multiplication circuits 171~178 of the error evaluator polynomial 132 respectively have a multiplier value comprising Galois fields and the multiplier value of the multiplication circuit 171 connected to the FF 181 with the above coefficient $\omega_1$ (hereafter referred to as $\omega_1$FF; other FFs to be similarly referred) is $\alpha^{136}$ (=$\alpha^{255-119}$). Subsequently, the multiplier value of multiplication circuit 172 of $\omega_2$FF 182 is $\alpha^{135}$ (=$\alpha^{255-120}$); the multiplier value of multiplication circuit 173 of $\omega_3$FF 183 is $\alpha^{134}$ (=$\alpha^{255-121}$); the multiplier value of multiplication circuit 174 of $\omega_4$FF 184 is $\alpha^{133}$ (=$\alpha^{255-122}$); the multiplier value of multiplication circuit 175 of $\omega_5$FF 185 is $\alpha^{132}$ (=$\alpha^{255-123}$); the multiplier value of multiplication circuit 176 of $\omega_6$FF 186 is $\alpha^{131}$ (=$\alpha^{255-124}$); the multiplier value of multiplication circuit 177 of $\omega_7$FF 187 is $\alpha^{130}$ (=$\alpha^{255-125}$), and the multiplier value of multiplication circuit 178 of $\omega_8$FF 188 is $\alpha^{129}$ (=$\alpha^{255-126}$).

In other words, the error evaluator polynomial generating circuit of an error detection polynomial generating means comprises a multiplication circuit part that comprises the multiplication circuit 171 having multiplier values that comprise Galois fields and the flip-flop (FF) circuit 181 that incorporates the variable value $\omega 1$ corresponding to the coefficients of the terms that form a generator polynomial of the error position detection polynomial or erroneous value polynomial, a group of multiplication circuits (that comprises multiplication circuits 171~178 and flip-flop (FF) circuits 181~188) that are formed with a plurality of the above described multiplication circuit parts arrayed in parallel, formation the exclusive OR (EOR) circuit connected to the outputs of respective multiplication circuits of the group of multiplication circuits and the shift register circuit. The polynomial generating circuit sets the multiplier values of the multiplication circuits into which the variables are entered with the first clock signal among a plurality of multiplication circuits in variables $\alpha^{136}$ comprising higher dimension Galois fields and subsequently sets the multiplier values of other multiplication circuits in variables $\alpha^{135}$, $\alpha^{134}$, $\alpha^{133}$ ... $\alpha^{129}$ comprising lower dimension Galois fields in the order of arrays.

Accordingly, the values of FFs 181~188 after t clock signals are respectively as follows:

$\omega_0$ FF 181 is $\omega_0 (\alpha^{255-t})^{119}$, $\omega_1$ FF 182 is $\omega_1 (\alpha^{255-t})^{120}$, $\omega_2$ FF 183 is $\omega_2 (\alpha^{255-t})^{121}$, $\omega_3$ FF 814 is $\omega_3 (\alpha^{255-t})^{122}$, $\omega_4$ FF 185 is $\omega_4 (\alpha^{255-t})^{123}$, $\omega_5$ FF 186 is $\omega_5 (\alpha^{255-t})^{124}$, $\omega_6$ FF 187 is $\omega_6 (\alpha^{255-t})^{125}$, and $\omega_7$ FF 188 is $\omega_7 (\alpha^{255-t})^{126}$.

The solution of the numerator of erroneous value $e_{255-t}$ after t clock signals is as given below.

$$\alpha^{(255-t)119}\omega(\alpha^{255-t})=\omega_0(\alpha^{255-t})^{119}+\omega_1(\alpha^{255-t})^{120+} \cdots +\omega_7(\alpha^{255-t})^{126}$$

Accordingly, the value of variable x is substituted in the order of $x=\alpha^{254}, \alpha^{253}, \alpha^{252}, \ldots, \alpha^2, \alpha^1, \alpha^0$ by supplying the clock signals and carrying out calculations in sequence from $\sigma(\alpha^{254})$ to $\sigma(\alpha^0)$. Thus, in FIG. 10, the solution $\alpha^{-j1\cdot 119}\cdot\omega(\alpha^{-j1})$ of the numerator of the erroneous value $e_{j1}$ is obtained in sequence from position 0 to position 254.

Thus, in the case of this embodiment, the error positions and the erroneous values are not obtained in sequence from the leading position 254 (MSB) of the conventional data and the data input sequence is reversed and the processing is made reverse to the conventional processing. Therefore, the error position is obtained in sequence from position 0 in the error position detection circuit 131 reversely to the forward chain search, in other words, in the reverse chain search an unnecessary processing from position 254 – position 120, as in the execution of conventional error correction processing of data, is eliminated and, in the case of an optical disk with the Reed-Solomon coded word having the code length of 120 bytes smaller than 255 bytes, the error position detection processing can be immediately carried out and the speed of the error position detection processing can be increased. Moreover, since it is intended only to change and set the multiplier values of multiplication circuits 141~148 and 171~178, the reverse chain search can be carried out with a simple configuration without increasing the amount of hardware.

Therefore, the solutions of the error locator polynomial are obtained in sequence from the lowest order position toward the higher order position of coded word data of which elements comprise the Galois fields (finite fields). In other words, it is determined whether the data at respective positions are faulty in sequence from the lowest order position. Accordingly, the error position detection processing can be immediately started even for data with a short code length and wasteful processing is not executed as in the case of obtaining solutions in sequence from the highest order position.

The following describes the structure of the syndrome generating means for use in the error correction processor in accordance with the present invention.

As regards the syndrome generating circuit to be used in relation to the generation of the above described ECC code and the CRC code, the applicant of the present invention has proposed an efficient circuit structure. In the processing of data, the present invention, differing from the conventional method as described above, allows the changing of the data input direction, the entering of data starting from the lower order information of the data, the entering of the multiplication coefficients in the circuits for processing the error locator polynomial and the error evaluator polynomial starting from those with lower dimension Galois fields and the reversal of the direction of processing. On the other hand, the syndrome generating circuit having the conventional structure cannot perform the processing and therefore an improvement thereby solving such a problem is required.

Specifically, the conventional syndrome generating circuit, where the data are entered as coefficients in sequence from the highest order position to the lowest order position 0, cannot be matched with the reverse chain search circuit for detecting the error position in sequence from the lowest order position 0 to the highest order position 119 using the error locator polynomial and the error evaluator polynomial to speed up the chain search.

The syndrome generating circuit in accordance with the present invention is invented to solve the above described problem and intended to provide a syndrome generating method for the error correction system capable of entering data in sequence from the lowest order position to the highest order position and generating a syndrome of the syndrome polynomial based on data from the recording medium.

The following describes the syndrome generating circuit and the method thereof in accordance with the present invention, referring to the drawings.

Figure 6:
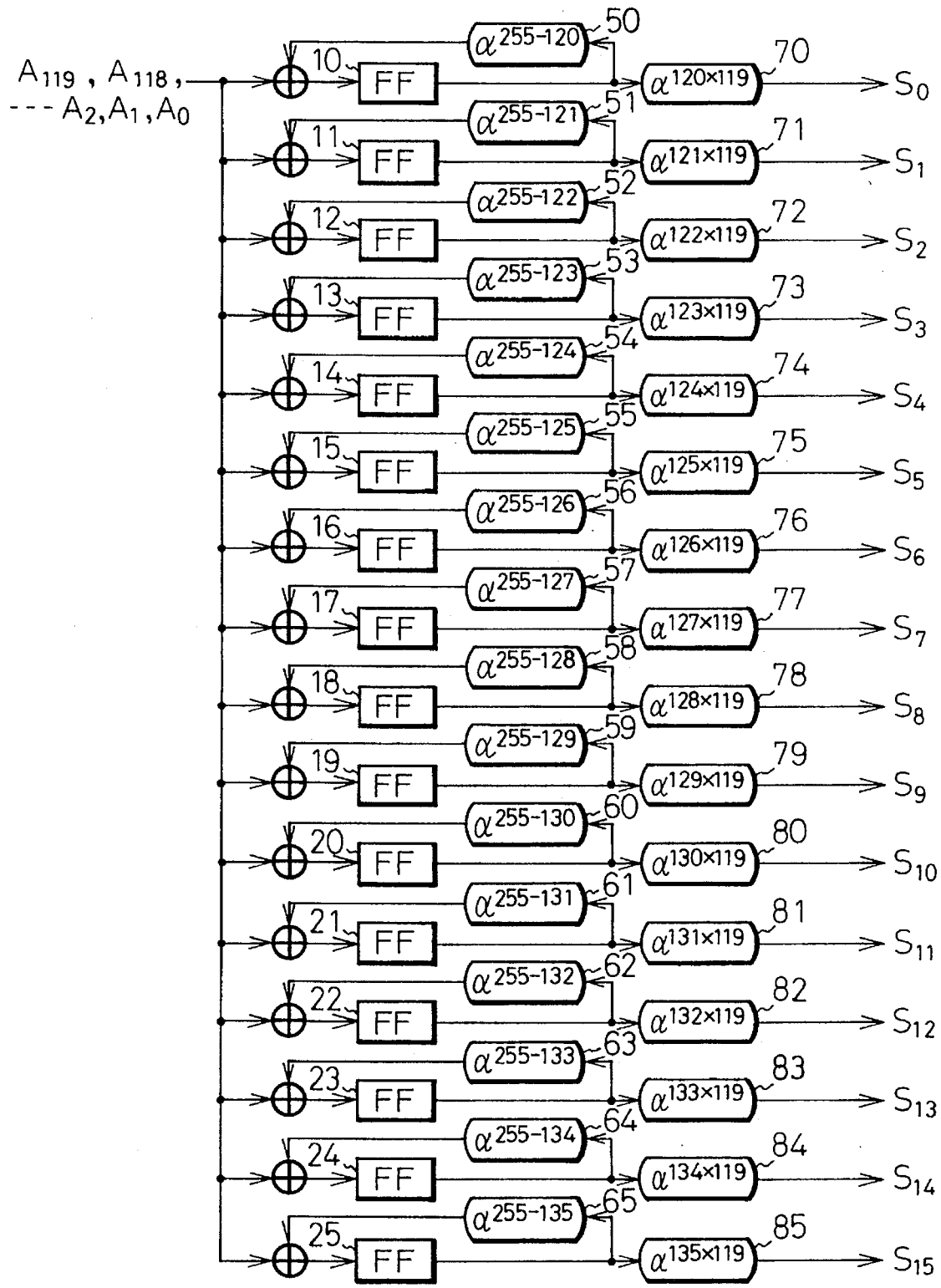
FIG. 6 is a block diagram showing an example of a syndrome generating circuit in accordance with the present invention.

FIG. 6 shows an example structure of the syndrome generating circuit for use in the present invention, which is built in the error correction processor provided in the optical disk control system. The syndrome generating circuit comprises sixteen flip-flops (hereafter referred to as "FF") 10–25, sixteen first multiplication circuits 50–65 using the EOR matrixes for multiplying input values by $\alpha^i$ ($i=\alpha^{255-120}\sim \alpha^{255-135}$) provided corresponding to FFs 10–25 and sixteen second multiplication circuits 70–85 for multiplying the polynomials A ($\alpha^i$) respectively obtained by the corresponding FFs and the first multiplication circuits. Sixteen FFs 10–25 are 8-bit FFs and the initial values are set as 0 in FFs.

On the other hand, the first multiplication circuits 50–60 have different multiplier values that respectively comprise the Galois fields. The multiplier value of the first multiplication circuit 50 connected to the FF 10 with an operation route is $\alpha^{255-120}$; the multiplier value of the first multiplication circuit 51 connected to the FF 11 with a calculation route is $\alpha^{255-121}$; the multiplier value of the first multiplication circuit 52 connected to the FF 12 with an operation route is $\alpha^{255-122}$; the multiplier value of the first multiplication circuit 53 connected to the FF 13 with an operation route is $\alpha^{255-123}$, and similarly the corresponding multiplier values $\alpha^{255-124}\sim\alpha^{255-135}$ are set in advance in the first multiplication circuits 54–65.

The second multiplication circuits 70–85 have different multiplier values that respectively comprise the Galois fields. The multiplier value of the second multiplication circuit 70 in the operation route of the FF10 is $\alpha^{120*119}$; the multiplier value of the second multiplication circuit 71 in the operation route of the FF11 is $\alpha^{121*119}$; the multiplier value of the second multiplication circuit 72 in the operation route of the FF12 is $\alpha^{122*119}$; the multiplier value of the second multiplication circuit 73 in the operation route of the FF13 is $\alpha^{123*119}$, and similarly the corresponding multiplier values $\alpha^{124*119}\sim\alpha^{135*119}$ are set in advance in the second multiplication circuits 74–85.

The syndrome generating circuit for ECC in the present invention comprises a multiplication circuit part that comprises the flip-flop (FF) circuit 10 incorporating the variable values corresponding to the coefficients of the terms forming the syndrome generator polynomial, the first multiplication circuit 50 having a multiplier value comprising a Galois field and the second multiplication circuit 70 for multiplying a multiplier value comprising the Galois field against the multiplication results of the flip-flop (FF) circuit 10 and the first multiplication circuit 50, and a group of multiplication circuits formed with a plurality of multiplication circuit parts that are arrayed in parallel formation. In the plurality of multiplication circuit parts of this syndrome generator circuit, an appropriate multiplier value in the first multiplication circuit of the multiplication circuit part into which a variable is entered with the first clock signal is set to a reciprocal $\alpha^{255-120}$ of a variable comprising low order Galois fields and subsequently the multiplier values of other multiplication circuits are set to reciprocals $\alpha^{255-120}$, $\alpha^{255-121}$, $\alpha^{255-122}$, $\alpha^{255-123}$ ... $\alpha^{255-135}$ of the variables comprising high-dimension Galois fields in the order of array, and simultaneously an appropriate multiplier value in the second multiplication circuit of the multiplication circuit part into which a variable is entered with the first clock signal is set to a reciprocal $\alpha^{120*119}$ of a variable comprising low order Galois fields and subsequently the multiplier values of other multiplication circuits are set to variables $\alpha^{121*119}$, $\alpha^{122*119}$, $\alpha^{123*119}$, $\alpha^{124*119}$ ... $\alpha^{134*119}$ and $\alpha^{135*119}$ of the variables comprising high-dimension Galois fields in the order of array.

The operation of the syndrome generator circuit constructed as above is described below.

When values $A_0, A_1, \ldots A_{117}, A_{118}, A_{119}$ of data of 120 bytes shown in FIG. 10 are output in sequence from position 0 to position 119 in the operation route formed by the FF10 and the first multiplication circuit 50 providing the multiplier value $\alpha^{255-120}$, the value of data is $A_0$ with the first clock signal and subsequently the value of data is as given below with the second clock signal $$A_0\alpha^{255-120}+A_1$$

(+ denotes the exclusive OR as in the following), the value of data is as given below with the third clock signal $$A_0(\alpha^{255-120})^2+A_1\alpha^{255-120}=A_2,$$

and the value of data is as given below with 120th clock signal:

$$A_0(\alpha^{255-120})^{119}+A_1(\alpha^{255-120})^{118}+\ldots+A_{117}(\alpha^{225-120})^2 A_{118}(\alpha^{255-120})+A_{119}$$

In the operation route formed by the FF11 and the multiplication circuit 51 providing the multiplier value $\alpha^{255-121}$, the value of data is as given below with the 120th clock signal:

$$A_0(\alpha^{255-121})^{119}+A_1(\alpha^{255-121})^{118}+\ldots+A_{117}(\alpha^{255-121})^2+A_{118}(\alpha^{255-121})+A_{119}$$

In this connection, in the operation route formed by the FF25 and the multiplication circuit 65 providing the multiplier value $\alpha^{255-135}$, the value of data is as given below with the 120th clock signal:

$$A_0(\alpha^{255-135})^{119}+A_1(\alpha^{255-135})^{118}+\ldots+A_{117}(\alpha^{255-135})^2+A_{118}(\alpha^{255-135})+A_{119}$$

In the operation route formed by the FF10 and the first multiplication circuit 50 providing the multiplier value $\alpha^{255-120}$, the output at the time of the 120th clock signal is multiplied by the multiplier value $\alpha^{120*119}$ in the second multiplication circuit 70 and becomes as given below:

$$A_0 + A_1\alpha^{120} + A_2\alpha^{120*2} + \ldots + A_{118}\alpha^{120*118} + A_{119}\alpha^{120*119}$$

In the operation route comprising the FF10 and the first and second multiplication circuits 50 and 70, the syndrome S0=A ($\alpha^{120}$) of the polynomial A (x) is obtained. Moreover, in this case, the syndrome of the polynomial A ($\alpha^{120}$) can be obtained only by entering the values $A_0, A_1, \ldots A_{117}$, $A_{118}$ and $A_{119}$ in sequence from position 0 to position 119 of 120-bytes data.

Similarly, in the operation route comprising the FF11 and the multiplication circuit 51, the output at the time of the 120th clock signal is multiplied by the multiplier value $\alpha^{121*119}$ to become as given below:

$$A_0 + A_1\alpha^{121} + A_2\alpha^{121*2} + \ldots + A_{118}\alpha^{121*118} + A_{119}\alpha^{121*119}$$

In the operation route comprising the FF11 and the first and second multiplication circuits 51 and 71, the syndrome S1=A ($\alpha^{121}$) of the polynomial A (x) is obtained. Moreover, the syndrome of the polynomial A ($\alpha^{120}$) can be obtained only by entering the values $A_0, A_1, \ldots A_{117}, A_{118}$ and $A_{119}$ in sequence from position 0 to position 119 of 120-bytes data. In this connection, in the operation route comprising the FF25 and the first multiplication circuit 65, the output at the time of the 120th clock signal is multiplied by the multiplier value $\alpha^{135*119}$ in the second multiplication circuit 85 to become as given below:

$$A_0 + A_1\alpha^{135} + A_2\alpha^{135*2} + \ldots + A_{118}\alpha^{135*118} + A_{119}\alpha^{135*119}$$

Accordingly, in the operation route comprising the FF25 and the first and second multiplication circuits 65 and 85, the syndrome S15A ($\alpha^{135}$) of the polynomial A (x) is output at the time of the 120th clock signal only by entering in sequence the values $A_0, A_1, \ldots A_{117}, A_{118}$ and $A_{119}$ at position 0 to position 119 of 120-bytes data.

As described above, in this embodiment, a syndrome can be generated by entering the values in sequence from position 0, contrary to the conventional method by which the syndrome is generated by entering the values as the coefficients of the polynomial A ($\alpha^i$) in sequence from position 119. Consequently, the reverse chain search circuit for inspecting an error position in sequence from the lowest position 0 to the highest position 119 using, for example, the error locator polynomial and the error evaluator polynomial can be matched with the CRC syndrome generating circuit and the reverse chain search and the speed of the correction processing time can be increased. Moreover, the syndrome generating circuit of this embodiment can be made up only by adding the second multiplication circuits 70-85 in addition to FFs 10-25 and the first multiplication circuits 50-65 corresponding to the conventional syndrome generating circuit and therefore a syndrome can be generated by entering in sequence the values from position 0 to position 119 with a simple structure without increasing the amount of hardware.

The above described syndrome generating circuit for use in the present invention is formed so as to generate a syndrome regarding ECC codes, and the circuit for generating the syndrome regarding CRC codes is basically the same as that shown in FIG. 6. The number of bytes used for the CRC code is 4 and therefore the CRC circuit is formed only with four upper multiplication circuit parts of the circuit shown in FIG. 6.

The procedure of the method for correcting recorded data of an optical disk by using the error correction processor according to the present invention is, for example, as described below.

Specifically, a system for correcting and processing errors of data formed with coded words consisting of the Galois fields (finite fields) in reading the data from a specified recording medium is an error correction processor that comprises the first process for processing a syndrome from all codes of the data, the second process for processing the syndrome and generating error detection polynomials that form an error position detection polynomial and an error evaluation polynomial defined in the present invention, the third process error for processing the error positions and the erroneous values at the error positions related to the recorded data from appropriate polynomials, and the fourth process for correcting and processing appropriate recorded data according to the error position and the erroneous value obtained from the above processing, wherein, at least for operations in the error detection polynomial generating processing and the error detection processing in the third process, the processing is carried out in sequence from low order information to high order information of the recorded data, and the error correction processing method can be an error correction processing method including the fifth process for processing a syndrome from the recorded data that has been corrected and processed and checking the cyclic redundancy check (CRC) codes defined by the present invention to detect whether or not the correction of the error position of the recorded data that has been corrected and processed by the correction means is appropriate.

Processing means in the cyclic redundancy check (CRC) code detection process can be an error correction processing method for processing the recorded data in sequence from the low order position to the high order position.

Figure 7B:
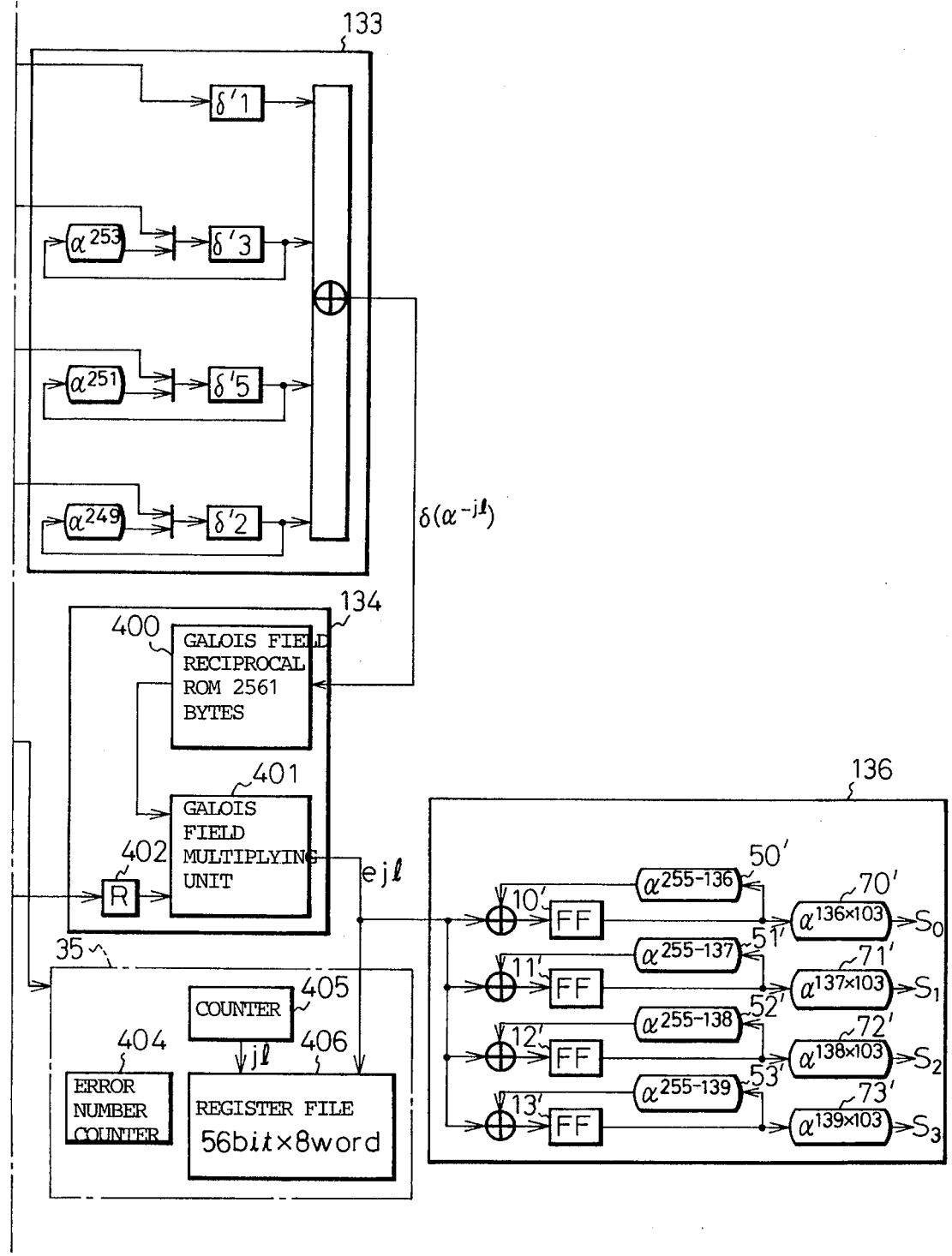
Figure 9:
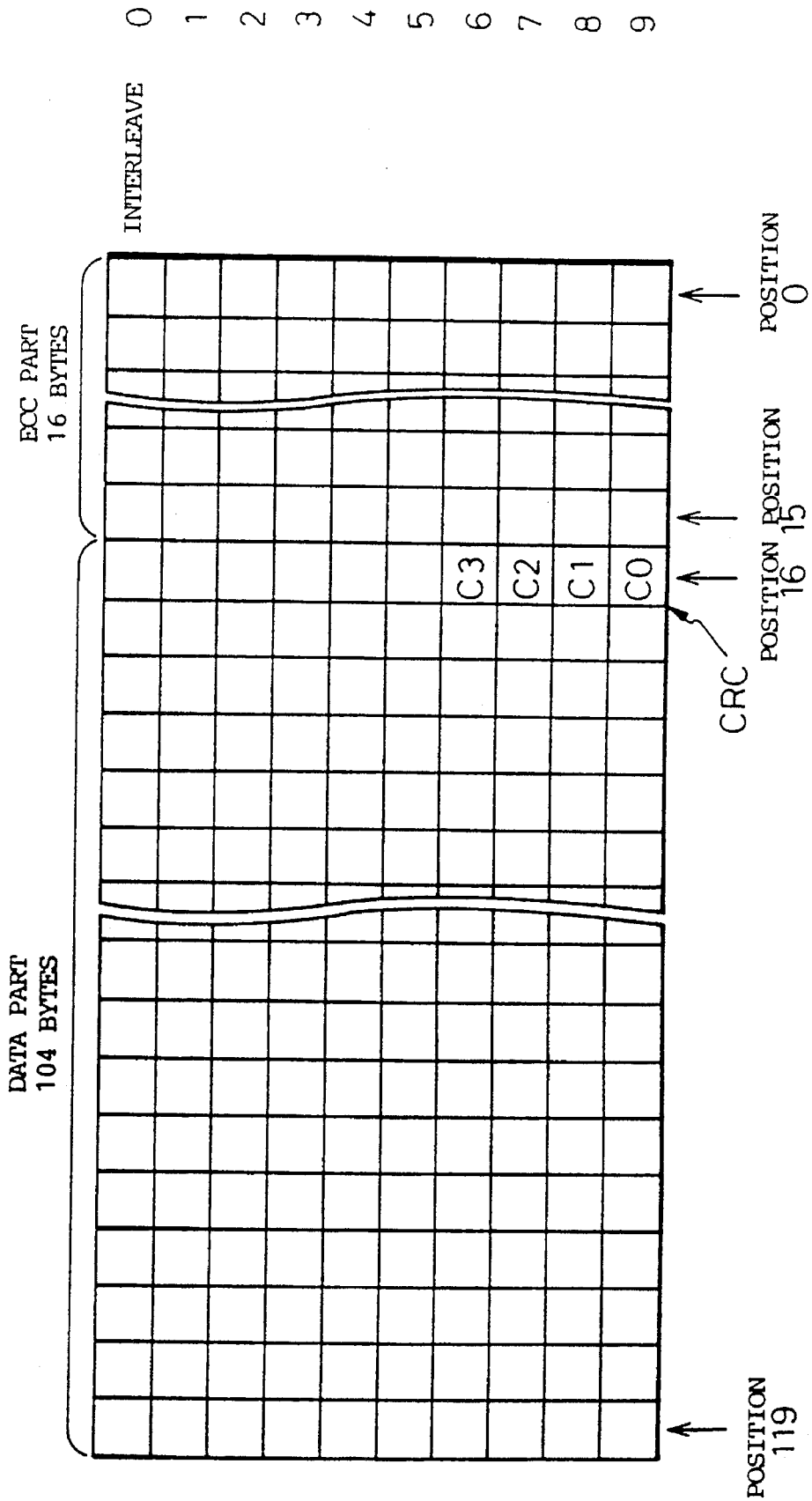
FIG. 9 is a diagram for illustrating the conventional data array of the interleave format.

The overall block diagram showing an example of the error correction processor in accordance with the present invention is shown in FIG. 7.

FIG. 7 roughly corresponds to FIG. 4 and illustrates an example circuit that forms the blocks shown in FIG. 4, and the functions of these blocks are as described above.

The erroneous value calculation circuit 134 comprises the Galois field reciprocal ROM 400, Galois field multiplying unit 401 and timing adjusting flip-flop 402.

The error detection circuit 135 is connected with the error position detection circuit 131 and the zero detection circuit and has the error counter 404, position counter 405 and register file 406. The output of the error detection circuit 135 is connected to the CPU bus.

The output of the erroneous value calculation circuit 134 is connected to the CRC syndrome generating circuit 136, which also receives the control signals from the internal bus.

As described in detail above, the present invention provides excellent effects such as speeding up the chain search without increasing the amount of hardware, and the reduction of correction and processing time.

In addition, the present invention provides excellent effects that allow the generation of a syndrome of polynomials based on data of recording media by entering the data in sequence from the lowest order position to the highest order position and, for example, ensuring matching with the reverse chain search circuit for inspecting an error position in sequence from the lowest position to the highest position by using the error locator polynomial and the error evaluator polynomial that are used in combination in the error correction processor, thus speeding up the correction processing time.

I claim:

1. An error correction processor that is an error correction processing circuit comprising an error detection circuit for processing a syndrome from all codes of data formed with coded words comprising Galois fields (finite fields) when data are read out from a predetermined recording medium, and processing error positions related to a specified data and erroneous values at said error positions from said syndrome, and correction circuit for correcting and processing said data based on the error positions and the erroneous values obtained from said processing in a system for correcting and processing the errors of said data in reading said data from a specified recording medium, wherein at least a processing circuit of said error detection circuit is adapted to carry out processing so that the data is obtained in sequence from a low order position to a high order position of data, and wherein a syndrome processing circuit comprises a multiplication circuit part that comprises a first multiplication circuit that has a flip-flop (FF) circuit that incorporates variable values corresponding to the coefficients of the terms that form a syndrome generating polynomial and the multiplier values comprising Galois fields and a second multiplication circuit for multiplying a result of multiplication of said flip-flop (FF) circuit and said first multiplication circuit by the multiplier values, and a group of multiplication circuits that are arrayed in parallel formation; said multiplier values in said first multiplication circuits of said plurality of multiplication circuit parts being set to the reciprocals of the variables comprising Galois fields that are set so that the solutions from the low order position to the high order position of input data and said multiplier values in the second multiplication circuit of said multiplication circuit part being set to the reciprocals of the variables comprising Galois fields.

2. An error correction processor in accordance with claim 1, wherein said error correction processing circuit is provided with a cyclic redundancy check code generating circuit for processing a syndrome from said data that has been corrected and processed and generating a cyclic redundancy check (CRC) code based on said syndrome to determine whether the correction of a corrected part of said data that has been corrected and processed by said error correction circuit is appropriate.

3. An error correction processor in accordance with claim 2, wherein said cyclic redundancy check (CRC) code generating circuit is adapted to carry out processing so that the data is obtained in sequence from a low order position of said recorded data.

4. An error correction processor that is an error correction processing circuit comprising an error detection circuit for processing a syndrome from all codes of data formed with coded words comprising Galois fields (finite fields) when data are read out from a predetermined recording medium, and processing error positions related to a specified data and erroneous values at said error positions from said syndrome, and correction circuit for correcting and processing said data based on the error positions and the erroneous values obtained from said processing in a system for correcting and processing the errors of said data in reading said data from a specified recording medium, wherein at least a processing circuit of said error detection circuit is adapted to carry out processing so that the data is obtained in sequence from a low order position to a high order position of data, wherein said error position detection and error evaluator generating circuit has an error position detection polynomial circuit and an erroneous value generating circuit that respectively comprise a multiplication circuit including a multiplier circuit part having multiplier values comprising Galois fields and a flip-flop circuit (FF) incorporating variable values corresponding to coefficients of the terms that form said error position detection polynomial or said erroneous value polynomial, a group of multiplication circuits made up of a plurality of multiplication circuits that are arrayed in parallel formation, an exclusive OR circuit connected to the outputs of each circuit of said group of multiplication circuits and a shift register circuit; said multiplier values of said plurality of multiplication circuits being set to such variables comprising Galois fields as the solutions from low order positions to high order positions of data.

5. An error correction processor that is an error correction processing circuit comprising an error detection circuit for processing a syndrome from all codes of data formed with coded words comprising Galois fields (finite fields) when data are read out from a predetermined recording medium, and processing error positions related to a specified data and erroneous values at said error positions from said syndrome, and correction circuit for correcting and processing said data based on the error positions and the erroneous values obtained from said processing in a system for correcting and processing the errors of said data in reading said data from a specified recording medium, wherein at least a processing circuit of said error detection circuit is adapted to carry out processing so that the data is obtained in sequence from a low order position to a high order position of data, wherein said error correction processing circuit is provided with a cyclic redundancy check code generating circuit for processing a syndrome from said data that has been corrected and processed and generating a cyclic redundancy check (CRC) code based on said syndrome to determine whether the correction of a corrected part of said data that has been corrected and processed by said error correction circuit is appropriate, and wherein said syndrome processing circuit for verifying the cyclic redundancy check (CRC) code comprises a multiplication circuit part that comprises a first multiplication circuit that has a flip-flop (FF) circuit that incorporates variable values corresponding to the coefficients of the terms that form a syndrome generating polynomial and the multiplier values comprising Galois fields and a second multiplication circuit for multiplying a result of multiplication of said flip-flop (FF) circuit and said first multiplication circuit by the multiplier values, and a group of multiplication circuits that are arrayed in parallel formation; said multiplier values in said first multiplication circuits of said plurality of multiplication circuit parts being set to the reciprocals of the variables comprising Galois fields that are set so that the solutions from the low order position to the high order position of input data and said multiplier values in the second multiplication circuit of said multiplication circuit part being set to the reciprocals of the variables comprising Galois fields.

6. An error correction processor that is an error correction processing circuit comprising an error detection circuit for processing a syndrome from all codes of data formed with coded words comprising Galois fields (finite fields) when data are read out from a predetermined recording medium, and processing error positions related to a specified data and erroneous values at said error positions from said syndrome, and correction circuit for correcting and processing said data based on the error positions and the erroneous values obtained from said processing in a system for correcting and processing the errors of said data in reading said data from a specified recording medium, wherein at least a processing circuit of said error detection circuit is adapted to carry out processing so that the data is obtained in sequence from a low order position to a high order position of data, wherein said error correction processing circuit is provided with a cyclic redundancy check code generating circuit for processing a syndrome from said data that has been corrected and processed and generating a cyclic redundancy check (CRC) code based on said syndrome to determine whether the correction of a corrected part of said data that has been corrected and processed by said error correction circuit is appropriate, wherein said cyclic redundancy check (CRC) code generating circuit is adapted to carry out processing so that the data is obtained in sequence from a low order position of said recorded data, and wherein said syndrome processing circuit for verifying the cyclic redundancy check (CRC) code comprises a multiplication circuit part that comprises a first multiplication circuit that has a flip-flop (FF) circuit that incorporates variable values syndrome generating polynomial and the multiplier values comprising Galois fields and a second multiplication circuit by the multiplier values, and a group of multiplication circuits that are arrayed in parallel formation; said multiplier values in said first multiplication circuits of said plurality of multiplication circuit parts being set to the reciprocals of the variables comprising Galois fields that are set so that the solutions from the low order position to the high order position of input data and said multiplier values in the second multiplication circuit of said multiplication circuit part being set to the reciprocals of the variables comprising Galois fields.

* * * * *

UNITED STATES PATENT AND TRADEMARK OFFICE
CERTIFICATE OF CORRECTION

PATENT NO. : 5,563,896                                   Page 1 of 2
DATED      : October 8, 1996
INVENTOR(S) : Yukimi NAKAGUCHI It is certified that error appears in the above-indentified patent and that said Letters Patent is hereby corrected as shown below:

Title Page,   Item 73, after "Japan" insert --Fujitsu VLSI Limited, Kasugai, Japan--;

Item 57, line 5, change "processing" to --processor--.

Col. 1, line 33, insert -- - -- between "Reed" and "Solomon";

line 34, insert -- - -- between "Reed" and "Solomon".

Col. 2,   line 46, change "($2^7$)" to --($2^8$)--.

Col. 5,   line 37, change "$A_2\alpha^{120*2}+A_1\alpha^{120}A_0$" to --$A_2\alpha^{120*2}+A_1\alpha^{120}+A_0$--

Col. 7,   line 62, change "galois" to --Galois--.

Col. 11,   line 49, change "practises" to --practices--.

UNITED STATES PATENT AND TRADEMARK OFFICE
CERTIFICATE OF CORRECTION

PATENT NO. : 5,563,896

DATED : October 8, 1996

INVENTOR(S) : Yukimi NAKAGUCHI

It is certified that error appears in the above-indentified patent and that said Letters Patent is hereby corrected as shown below:

Col. 12, line 29, after "is" insert $-\alpha^{251}$ $(=\alpha^{255-4})$; the multiplier value of multiplication circuit 145 of $\sigma_5$ FF 155 is-- line 33, change "$\pi_7$," to $-\sigma_7-$; change "$a^{257}$" to $-a^{247}-$;
line 45, insert --)-- after "151~158".

Col. 13, line 1, change "then" to --when--.

Col. 14, line 19, change "$\alpha^{j1.119}$." to $-\alpha^{j1 \bullet 119.}-$.

Signed and Sealed this

Fourth Day of March, 1997

Attest:

BRUCE LEHMAN

Attesting Officer

Commissioner of Patents and Trademarks